United States Patent
Mehrotra et al.

(10) Patent No.: US 10,424,646 B2
(45) Date of Patent: Sep. 24, 2019

(54) FIELD-EFFECT TRANSISTOR AND METHOD THEREFOR

(71) Applicant: NXP USA, INC., Austin, TX (US)

(72) Inventors: Saumitra Raj Mehrotra, Scottsdale, AZ (US); Ljubo Radic, Gilbert, AZ (US); Bernhard Grote, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/715,852

(22) Filed: Sep. 26, 2017

(65) Prior Publication Data

US 2019/0097003 A1    Mar. 28, 2019

(51) Int. Cl.
*H01L 29/40*  (2006.01)
*H01L 29/423*  (2006.01)
*H01L 29/66*  (2006.01)
*H01L 29/78*  (2006.01)
*H01L 29/06*  (2006.01)

(52) U.S. Cl.
CPC ........ *H01L 29/407* (2013.01); *H01L 29/0653* (2013.01); *H01L 29/4236* (2013.01); *H01L 29/42376* (2013.01); *H01L 29/66666* (2013.01); *H01L 29/66704* (2013.01); *H01L 29/7825* (2013.01); *H01L 29/7827* (2013.01)

(58) Field of Classification Search
CPC . H01L 29/404; H01L 29/407; H01L 29/7811; H01L 29/7823; H01L 29/7825
USPC ................................. 257/339, 343
See application file for complete search history.

(56) References Cited

U.S. PATENT DOCUMENTS

| | | |
|---|---|---|
| 4,553,151 A | 11/1985 | Schutten et al. |
| 5,316,959 A | 5/1994 | Kwan et al. |
| 5,324,683 A | 6/1994 | Fitch et al. |
| 5,407,860 A | 4/1995 | Stoltz et al. |
| 5,434,435 A | 7/1995 | Baliga |
| 5,723,891 A | 3/1998 | Malhi |
| 5,736,446 A | 4/1998 | Wu et al. |
| 5,770,507 A | 6/1998 | Chen et al. |
| 5,869,379 A | 2/1999 | Gardner et al. |
| 5,914,519 A | 6/1999 | Chou et al. |

(Continued)

FOREIGN PATENT DOCUMENTS

WO    2005093841    10/2005

OTHER PUBLICATIONS

Huang, T., "0.18um BCD Technology with Best-in-Class LDMOS from 6 V to 45 V", Proceedings of the 26th International Symposium on Power Semiconductor Devices & IC's, Jun. 15-19, 2014.

(Continued)

*Primary Examiner* — Mark V Prenty

(57) ABSTRACT

A transistor includes a trench formed in a semiconductor substrate with the trench having a first sidewall and a second sidewall. A vertical field plate is formed in the trench. The vertical field plate is located between the first sidewall and the second sidewall. A gate electrode is formed in the trench with a first edge of the gate electrode proximate to the first sidewall and a second edge of the gate electrode proximate to the vertical field plate. A dielectric material is formed in the trench between the first sidewall and the vertical field plate. An air cavity is formed in the trench between the vertical field plate and the second sidewall with the air cavity having a dielectric constant lower than that of the dielectric material.

13 Claims, 24 Drawing Sheets

(56) References Cited

U.S. PATENT DOCUMENTS

| | | | |
|---|---|---|---|
| 6,064,107 | A | 5/2000 | Yeh et al. |
| 6,277,700 | B1 | 8/2001 | Yu et al. |
| 6,858,500 | B2 | 2/2005 | Sugi et al. |
| 6,861,332 | B2 | 3/2005 | Park et al. |
| 6,864,135 | B2 | 3/2005 | Grudowski et al. |
| 6,946,348 | B2 | 9/2005 | Zeng |
| 7,368,785 | B2 | 5/2008 | Chen et al. |
| 7,400,024 | B2 | 7/2008 | Kunnen |
| 7,576,388 | B1 | 8/2009 | Wilson et al. |
| 7,709,889 | B2 | 5/2010 | Moens et al. |
| 7,759,206 | B2 | 7/2010 | Luo et al. |
| 7,800,167 | B2 | 9/2010 | Kitamura et al. |
| 7,893,488 | B2 | 2/2011 | Herbert |
| 7,923,776 | B2 | 4/2011 | Yilmaz et al. |
| 8,043,913 | B2 | 10/2011 | Yilmaz et al. |
| 8,304,312 | B2 | 11/2012 | Herbert |
| 8,319,278 | B1 * | 11/2012 | Zeng ................... H01L 29/7809 257/330 |
| 8,329,538 | B2 | 12/2012 | Pan et al. |
| 8,502,287 | B2 | 8/2013 | Radic et al. |
| 8,647,950 | B2 | 2/2014 | Zuniga et al. |
| 8,716,794 | B2 | 5/2014 | Luo et al. |
| 8,981,470 | B2 | 3/2015 | Nozu |
| 9,171,931 | B2 | 10/2015 | Ng et al. |
| 9,559,198 | B2 | 1/2017 | Stefanov et al. |
| 9,620,583 | B2 | 4/2017 | Kelkar et al. |
| 2004/0021233 | A1 | 2/2004 | Kinzer et al. |
| 2006/0001084 | A1 | 1/2006 | Kelly et al. |
| 2006/0017078 | A1 | 1/2006 | Thapar |
| 2006/0209586 | A1 | 9/2006 | Hirler |
| 2009/0256212 | A1 | 10/2009 | Denison et al. |
| 2010/0015770 | A1 | 1/2010 | Tai et al. |
| 2010/0244125 | A1 | 9/2010 | Sonsky et al. |
| 2013/0181723 | A1 | 7/2013 | Mauder et al. |
| 2013/0334565 | A1 | 12/2013 | Hutzler et al. |
| 2014/0021534 | A1 | 1/2014 | Verma et al. |
| 2014/0097492 | A1 | 4/2014 | Yu |
| 2014/0138739 | A1 | 5/2014 | Magri et al. |
| 2014/0225186 | A1 | 8/2014 | Abou-Khalil et al. |
| 2015/0137223 | A1 | 5/2015 | Siemieniec et al. |
| 2015/0380348 | A1 | 12/2015 | Noebauer et al. |
| 2015/0380538 | A1 | 12/2015 | Ogawa |
| 2016/0211348 | A1 | 7/2016 | Yoshida |
| 2016/0359029 | A1 | 12/2016 | Zeng et al. |
| 2017/0263767 | A1 | 9/2017 | Nishiwaki |
| 2017/0338337 | A1 | 11/2017 | Bobde et al. |
| 2018/0006109 | A1 | 1/2018 | Mauder et al. |
| 2019/0097046 | A1 | 3/2019 | Mehrotra et al. |

OTHER PUBLICATIONS

Kumar, M., "Extended-p+ Stepped Gate LDMOS for improved Performance", IEEE Transactions on Electron Devices, vol. 57, No. 7, Jul. 2010.

Lu, D,H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.

Takaya, H., "Floating Island and Thick Bottom Oxide Trench Gate MOSFET (FITMOS)—A 60V Ultra Low On-Resistance Novel MOSFET with Superior Internal Body Diode-", Proceedings of the 17th International Symposium on Power Semiconductor Devices & IC's, May 23-26, 2005.

U.S. Appl. No. 16/171,830, filed Oct. 26, 2018, entitled "Transistor Devices With Extended Drain Regions Located in Trench Sidewalls".

U.S. Appl. No. 16/174,955, filed Oct. 30, 2018, entitled "Vertical Transistor With Extended Drain Region".

Non-final office action dated Oct. 15, 2018 in U.S. Appl. No. 15/715,816.

Fujishima, D.H., "integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.

U.S. Appl. No. 15/715,816, filed Sep. 26, 2018, entitled "Field-Effect Transistor and Method Therefor".

U,S. Appl. No. 15/15/715831, filed Sep. 26, 2016, entitled "Field-Effect Transistor and Method Therefor".

U.S. Appl. No. 15/918,563, filed Mar. 12, 2018, entitled "Transistor Trench Structure With Field Plate Structures".

U.S. Appl. No. 16/141,674, filed Sep. 25, 2018, entitled "Transistor Devices With Control-Terminal Field Plate Structures in Treches".

U.S. Appl. No. 16/205,461, filed Nov. 30, 2018, entitled "Transistor With Gate/Field Structure".

Cha, H., "0.18um 100V-rated BCD with Large Area Power LDMOS with ultra-low effective Specific Resistance", IEEE 2016.

Cheng, K., "Air Spacer for 10nm FinFET CMOS and Beyond", IEEE 2016.

Chil, M., "Advanced 300mm 130NM BCD technology from 5V to 85V with Deep-Trench Isolation", IEEE 2016.

Yang, H., "Low-Leakage SMARTMOS 10W Technology at 0.13um Node with Optimized Analog, Power and Logic Devices for SOC Design", IEEE 2008.

Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.

Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.

Non-final office action dated Feb. 21, 2019 in U.S. Appl. No. 15/715,816.

Non-final office action dated Apr. 9, 2019 in U.S. Appl. No. 15/715,831.

Final office action dated Jun. 7, 2019 in U.S. Appl. No. 15/715,816.

Final office action dated Jul. 18, 2019 in U.S. Appl. No. 15/715,831.

Non-final office action dated Jul. 25, 2019 in U.S. Appl. No. 15/918,563.

Non-final office action dated Aug. 8, 2019 in U.S. Appl. No. 15/715,816.

* cited by examiner

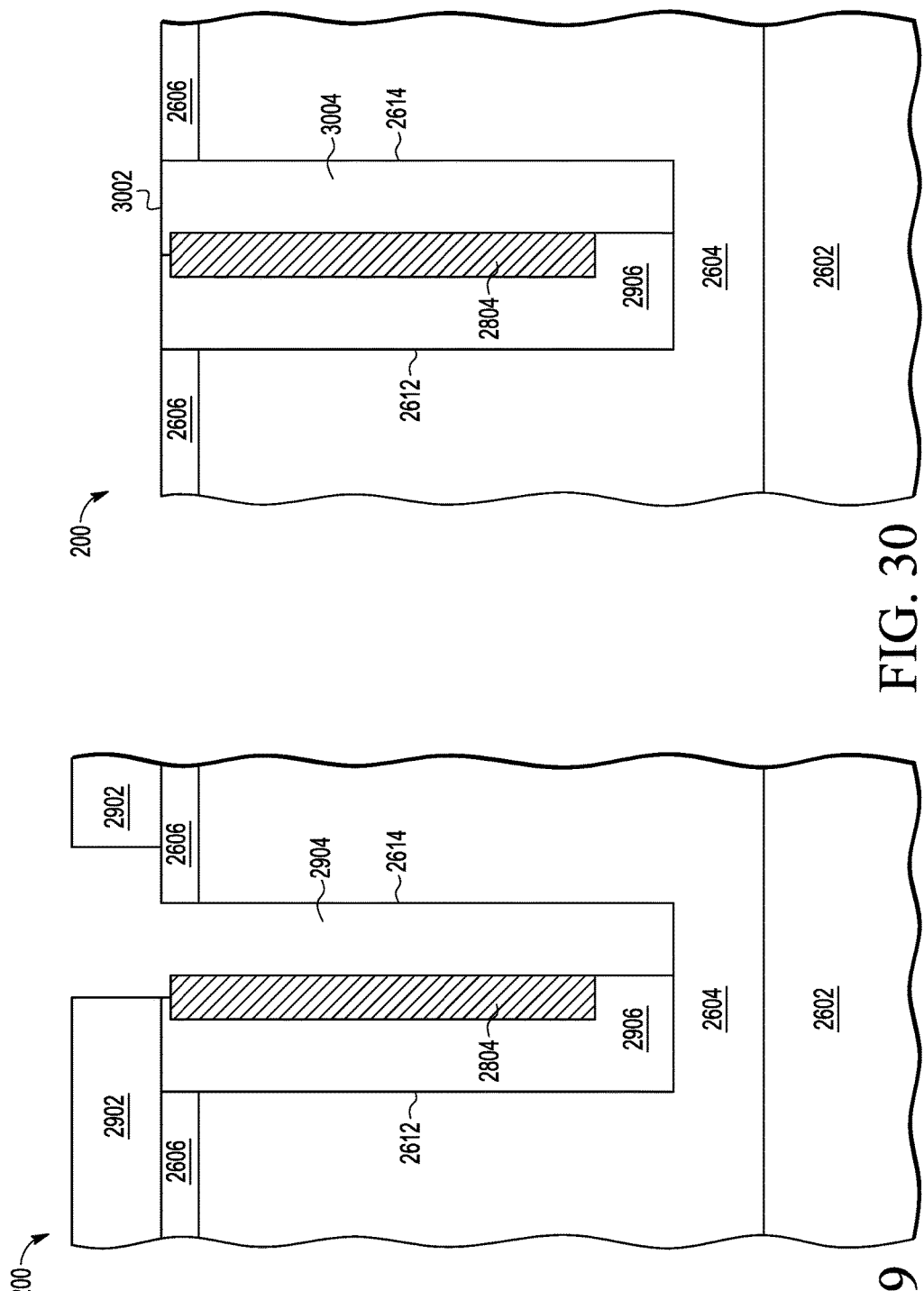

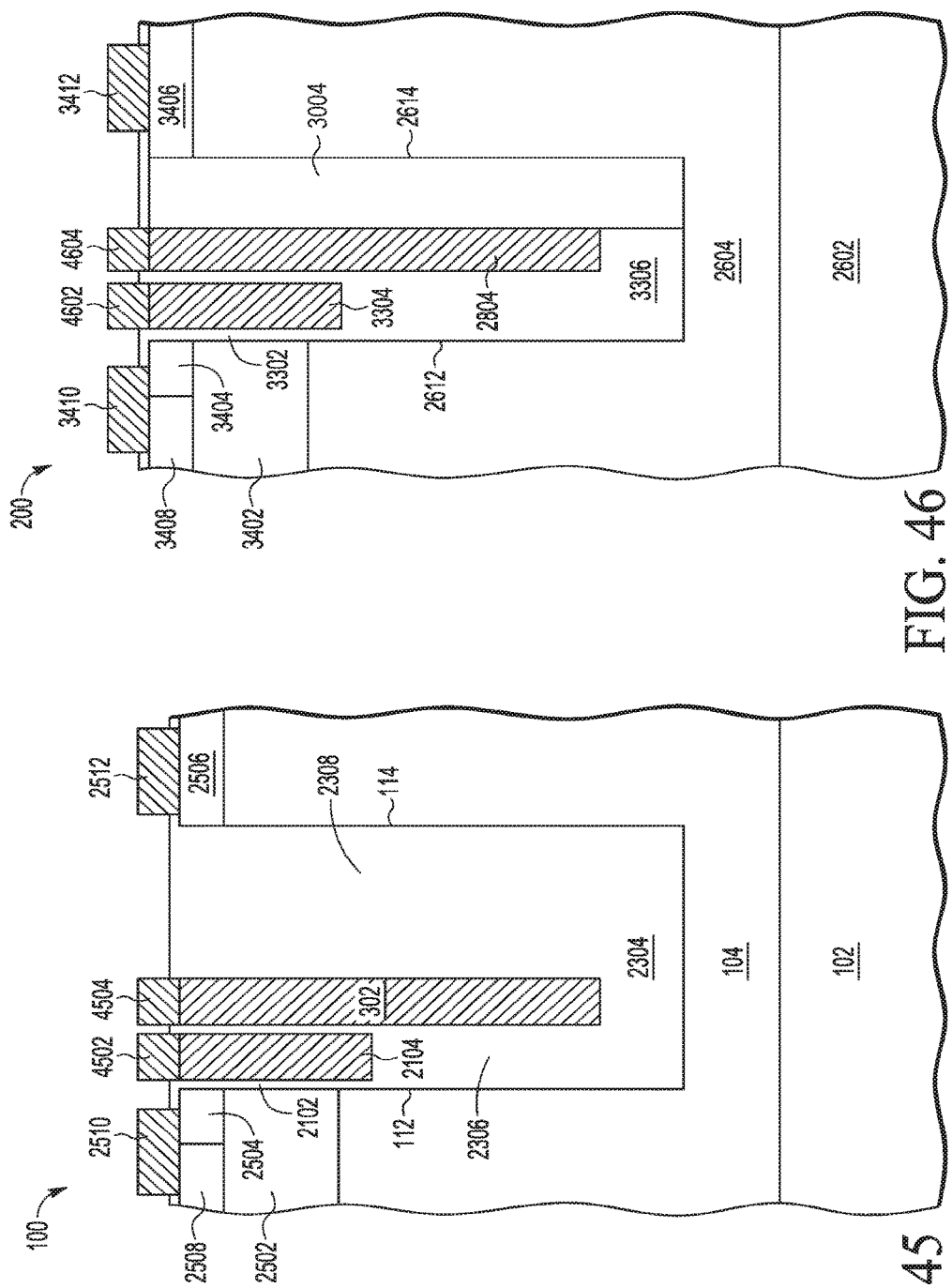

FIELD-EFFECT TRANSISTOR AND METHOD THEREFOR

BACKGROUND

Field

This disclosure relates generally to semiconductor devices, and more specifically, to field effect transistors (FET) and method of forming the same.

Related Art

Traditional semiconductor devices and semiconductor device fabrication processes are well known. For example, metal oxide semiconductor field-effect transistors (MOSFETs) are commonly used in a variety of different applications and electronic products—from sewing machines to washing machines, from automobiles to cellular telephones, and so on. As process technology progresses, these semiconductor devices are expected to reduce in size and cost while increasing performance. However, challenges exist in balancing size, cost, and performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 20 through FIG. 25 illustrate, in simplified cross-sectional view, stages of manufacture of exemplary FET formed in accordance with another embodiment of the present invention.

FIG. 26 through FIG. 34 illustrate, in simplified cross-sectional view, stages of manufacture of exemplary FET formed in accordance with another embodiment of the present invention.

FIG. 42 through FIG. 47 illustrate, in simplified cross-sectional view, exemplary FET formed in accordance with other embodiments of the present invention.

DETAILED DESCRIPTION

In recent years, automotive, industrial, and consumer applications have had increasing demands on smart power technologies which integrate digital, analog, and high-voltage power transistors on a single chip aimed to lower manufacturing costs. In semiconductor manufacturing, silicon area is at a premium. Desirable improved on-resistance*area (RonA) values of power transistors with reduced silicon area impact is one example of technological improvement occurring in a trench-based transistor with surface drain as described herein.

Generally, there is provided, a semi-vertical power field effect transistor (FET) and method of forming the same. A trench formed in a semiconductor substrate includes a gate electrode and field plate which provides a compact footprint for the power FET. Source and drain regions are formed at the surface of the semiconductor substrate adjacent to the trench. By forming a drain side dielectric region in the trench to be substantially thicker than a source side dielectric region, higher breakdown voltages and improved RonA can be realized. For example, the thicker drain side dielectric reduces the electric field on the drain side. A second field plate formed in the drain side dielectric region can facilitate higher breakdown voltages as well. Another compact footprint of the power FET includes symmetrical source and drain side dielectric regions which employ a low-K region on the drain side to support high voltage.

FIG. 1 through FIG. 8 illustrate, in simplified cross-sectional views, various stages of manufacture of an exemplary semi-vertical field effect transistor (FET) 100 formed in accordance with an embodiment of the present invention.

Figure 1:
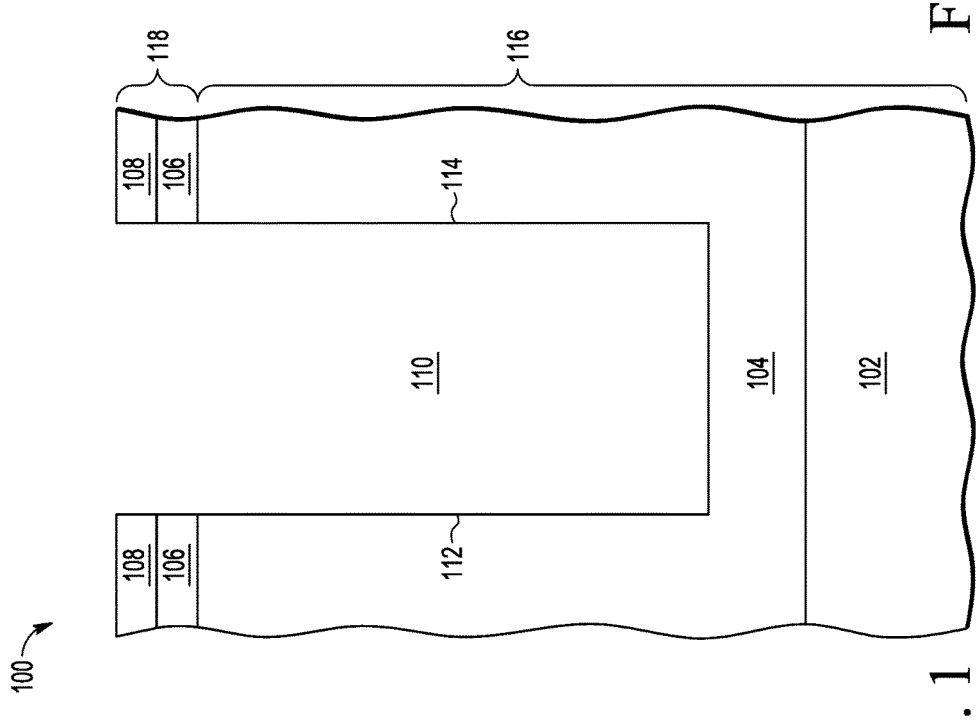

FIG. 1 illustrates in a simplified cross-sectional view, exemplary semi-vertical FET 100 at a stage of manufacture in accordance with an embodiment of the present invention. At this stage, exemplary semi-vertical FET 100 includes a silicon based substrate 116, a patterned hard mask 118 formed over the substrate, and a trench 110 formed in the substrate. Trench 110 includes a first sidewall 112 and a second sidewall 114. In this embodiment, substrate 116 includes a P-type doped silicon substrate 102 and an N-type epitaxial layer 104 formed at a top surface of the P-type doped silicon substrate 102. Substrate 116 may be formed from other suitable silicon-based substrates such as gallium arsenide, silicon germanium, silicon-on-insulator (SOI), silicon, monocrystalline silicon, the like, and combinations thereof, for example.

A pad oxide layer (not shown) is formed on substrate 116. A nitride layer 106 is formed on the pad oxide layer on substrate 116, and an oxide layer 108 is formed on the nitride layer 106. The nitride/oxide layers together are patterned to form hard mask 118. Photolithographic techniques and processing steps may be used to pattern, develop, and etch the nitride/oxide layers to form the hard mask 118. In this embodiment, hard mask 118 is formed over the epitaxial layer 104 of substrate 116. Other suitable materials and combinations thereof may be used to form hard mask 118. In this embodiment, trench 110 is formed in substrate 116 using hard mask 118. Etch techniques such as reactive ion etching (RIE) may be employed to form trench 110, for example.

Figure 2:
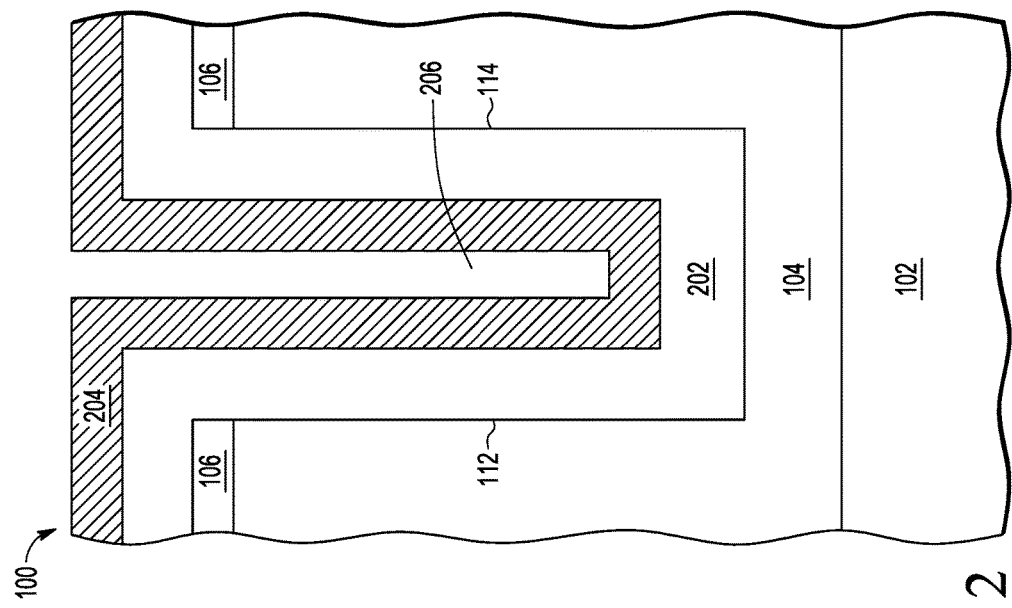
FIG. 1 through FIG. 8 illustrate, in simplified cross-sectional views, various stages of manufacture of an exemplary semi-vertical field effect transistor (FET) in accordance with an embodiment of the present invention.

FIG. 2 illustrates in a simplified cross-sectional view, exemplary semi-vertical FET 100 at a subsequent stage of manufacture in accordance with an embodiment of the present invention. At this stage, a dielectric layer 202 is formed covering the hard mask and trench 110 surfaces. Dielectric layer 202 essentially forms a liner layer at sidewalls 112-114 and bottom surfaces of trench 110. In this embodiment, dielectric layer 202 is formed from a grown oxide followed by a deposited oxide such as tetraethyl orthosilicate (TEOS). After dielectric layer 202 is formed, a field plate layer 204 is formed on the dielectric layer 202. In this embodiment, field plate layer 204 is formed from a conductive material, such as a polysilicon, deposited as a blanket layer covering oxide layer 202. A cavity 206 remains between sidewall portions of the field plate layer 204 within trench 110. In some embodiments, other conductive materials may be deposited as a field plate layer (204) covering the oxide layer 202.

Figure 3:
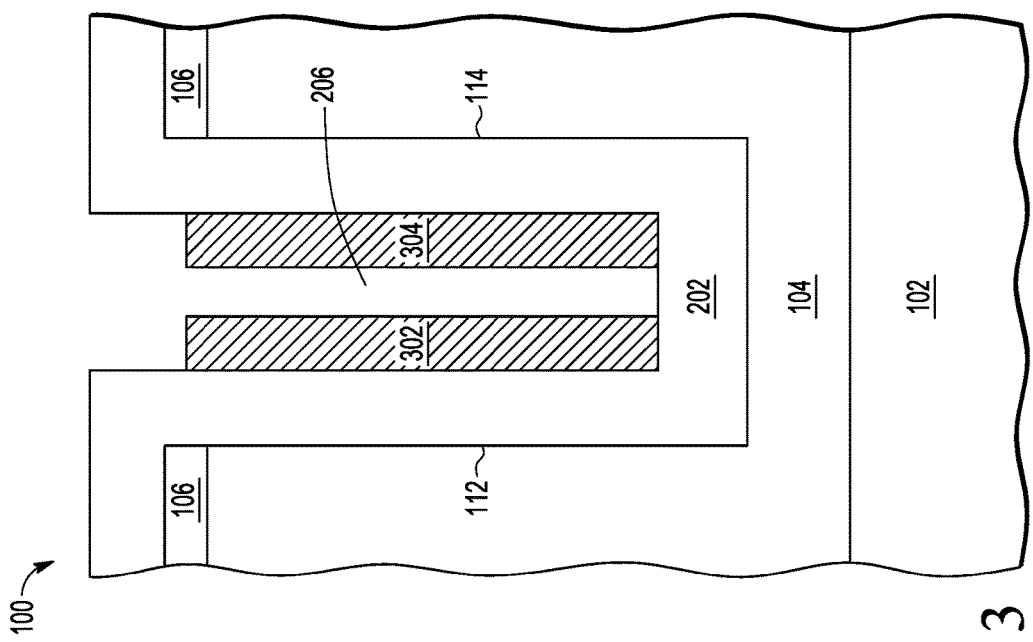

FIG. 3 illustrates in a simplified cross-sectional view, exemplary semi-vertical FET 100 at a subsequent stage of manufacture in accordance with an embodiment of the present invention. At this stage, field plate layer 204 is etched to form disconnected vertical field plates 302 and 304. In this embodiment, an anisotropic etch process is performed to remove a connecting portion of polysilicon at the bottom of cavity 206 to form conductive field plates 302 and 304, as well as recess top portions of each field plate.

Figure 4:
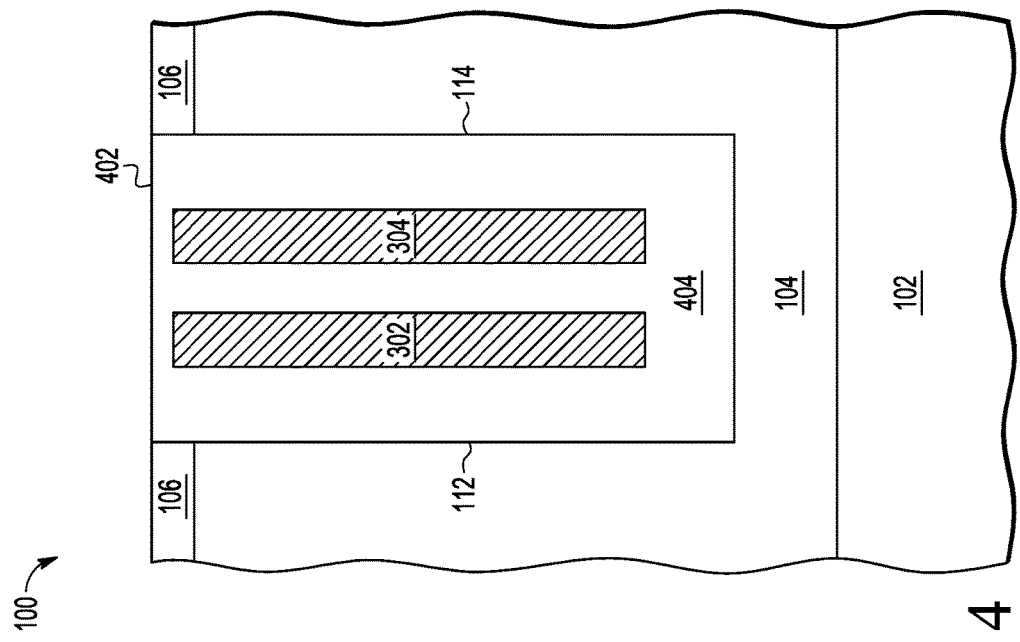

FIG. 4 illustrates in a simplified cross-sectional view, exemplary semi-vertical FET 100 at a subsequent stage of manufacture in accordance with an embodiment of the present invention. After etching the field plate layer 204 to form field plates 302 and 304, an oxidation process is performed at this stage providing an oxide seal on exposed portions of the vertical field plates 302 and 304. After exposed portions of field plates 302 and 304 are sealed, cavity 206 is filled with dielectric material. In this embodiment, the cavity 206 is filled with a deposited oxide such as TEOS. After cavity 206 is filled, a top surface is subjected to a planarization process forming a planar top surface 402. Dielectric region 404 encloses vertical field plates 302 and 304. In this embodiment, the planarization process may include a chemical-mechanical planarization (CMP) process. In other embodiments, the planarization process may include a wet etch process. In this embodiment, field plate 302 may be characterized as a source side field plate 302 and field plate 304 may be characterized as a drain side field plate.

Figure 5:
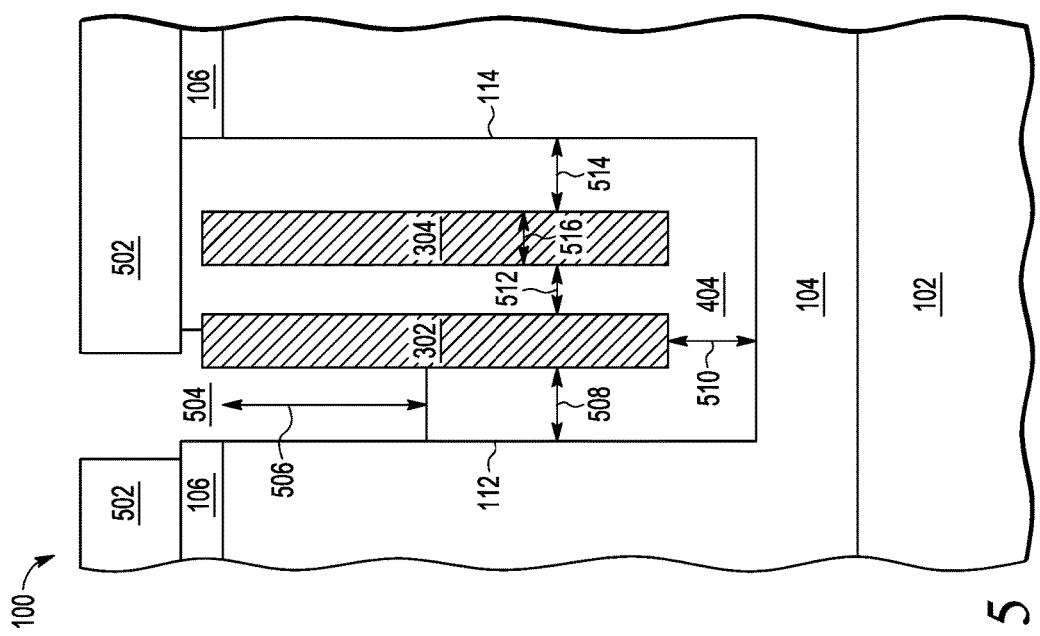

FIG. 5 illustrates in a simplified cross-sectional view, exemplary semi-vertical FET 100 at a subsequent stage of manufacture in accordance with an embodiment of the present invention. After dielectric region 404 enclosing field plates 302 and 304 is formed and top surface 402 is planarized, dielectric region 404 is etched to a depth 506 sufficient to form a gate electrode. A photoresist material 502 is applied at a top surface of semi-vertical FET 100 and patterned. Hard mask 106 and field plate 302 provide tolerance for alignment of the patterned photoresist material 502. A portion of dielectric region 404 is subsequently etched to a depth 506 forming a gate cavity region 504. In this embodiment, the depth 506 dimension corresponds approximately to a transistor gate length of the semi-vertical FET 100.

Dielectric region 404 includes source side dielectric thickness 508, bottom side dielectric thickness 510, intermediate dielectric thickness 512, drain side dielectric thickness 514, and drain side field plate thickness 516. In this embodiment, thicknesses 508, 510, and 514 may each have substantially a same thickness value in a range of 0.2-0.4 microns, thickness 512 may have a thickness value in a range of 0.3-0.5 microns, and thickness 516 may have a thickness value in a range of 0.15-0.35 microns for a given semi-vertical FET 100 voltage specification, for example. Other embodiments may include other thickness values for thicknesses 508-516 based on semi-vertical FET 100 voltage specifications. In some embodiments, it may be desirable to have asymmetrical dielectric thickness between source side dielectric and drain side dielectric. Because the combined drain side thicknesses of 512-516 is thicker than source side thickness 508, a technical advantage of higher breakdown voltage and lower on-resistance*area (RonA) can be achieved.

Figure 6:
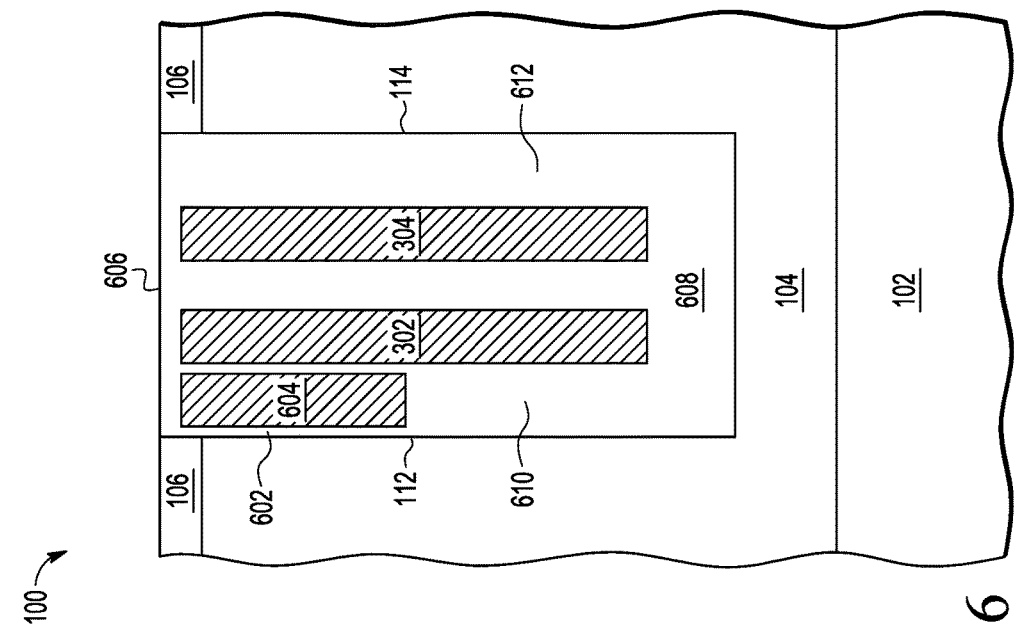

FIG. 6 illustrates in a simplified cross-sectional view, exemplary semi-vertical FET 100 at a subsequent stage of manufacture in accordance with an embodiment of the present invention. After forming gate cavity region 504 (FIG. 5), a gate electrode 604 is formed. At this stage of manufacture, patterned photoresist material 502 (FIG. 5) is removed. A gate dielectric region 602 is formed at the trench sidewall and other surfaces of gate cavity region 504. Gate dielectric region 602 may be formed by growing an oxide dielectric material to a predetermined thickness. After forming gate dielectric region 602, a conductive material (e.g. polysilicon) is deposited such that a remaining portion of the gate cavity region 504 is substantially filled to form gate electrode 604. After deposition of the conductive material, top surface 606 is planarized. In other embodiments, the planarization process may include a wet etch process. An oxide layer is grown to seal exposed portions of the conductive material. Dielectric region 608 surrounds other portions of gate electrode 604, and field plates 302 and 304. Dielectric region 608 includes a source side dielectric region 610 and a drain side dielectric region 612. The source side dielectric region 610 is located between sidewall 112 and vertical field plate 302, and the drain side dielectric region 612 is located between sidewall 114 and vertical field plate 304.

Figure 7:
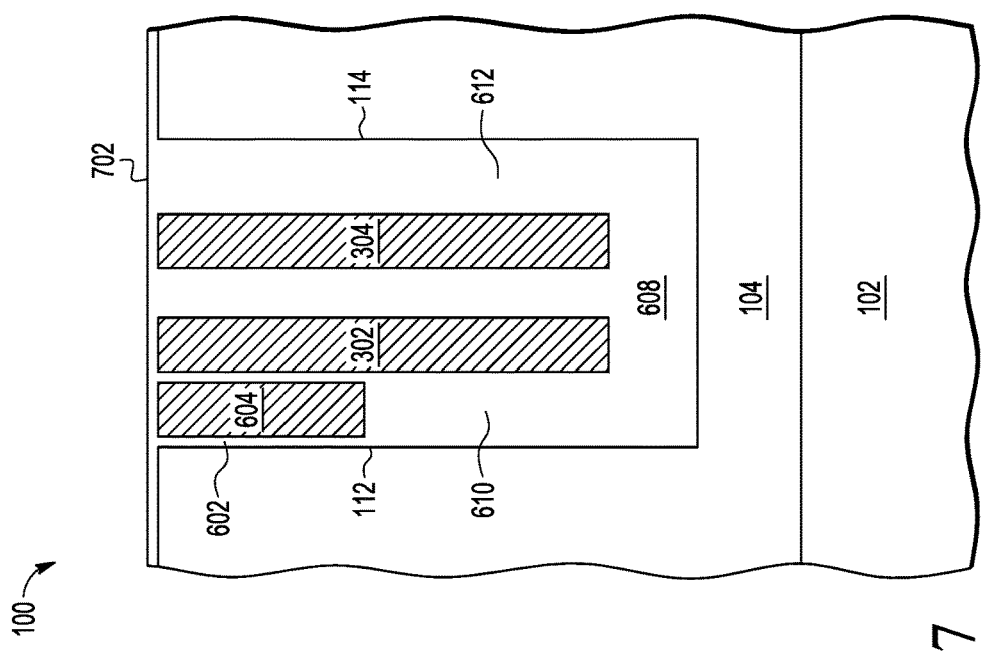

FIG. 7 illustrates in a simplified cross-sectional view, exemplary semi-vertical FET 100 at a subsequent stage of manufacture in accordance with an embodiment of the present invention. After planarizing top surface 606 (FIG. 6) and sealing the exposed portions of gate electrode 603 and field plate 302, hard mask material 106 is removed and gate electrode 604 and field plate regions are recessed from the top surface. After removing hard mask 106 and recessing gate electrode 604 and field plate regions, an oxide layer is grown at the top surface 702, sealing exposed portions of the gate electrode 604 and field plate regions. Dielectric region 608 surrounds other portions of gate electrode 604, source field plate 302 and drain field plate 304.

Figure 8:
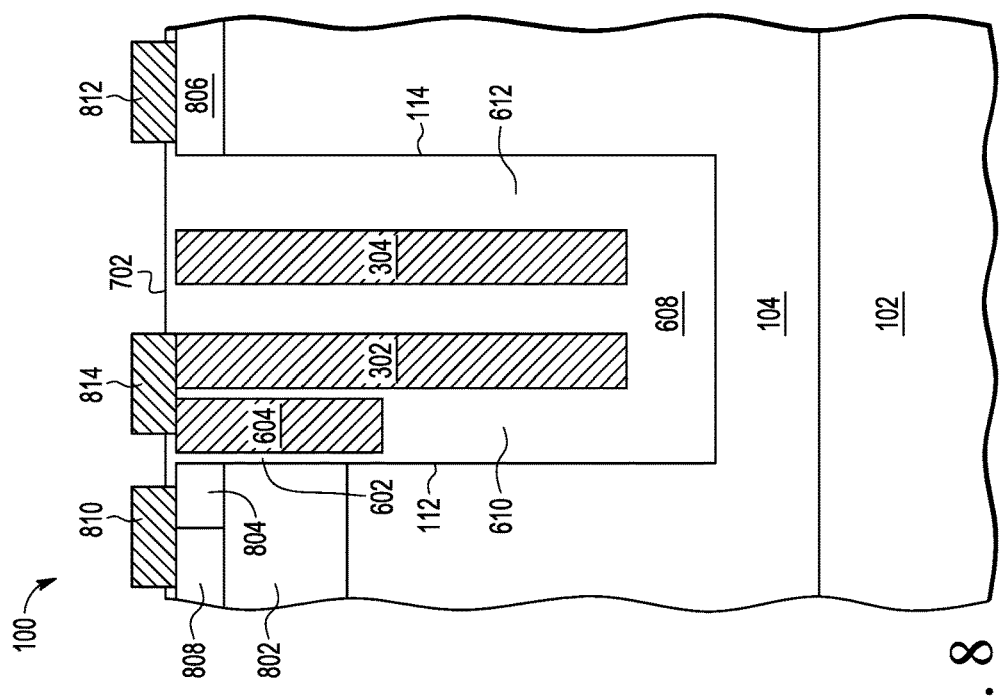

FIG. 8 illustrates in a simplified cross-sectional view, exemplary semi-vertical FET 100 at a subsequent stage of manufacture in accordance with an embodiment of the present invention. At this stage of manufacture, semi-vertical FET 100 includes body region 802, source and drain regions 804 and 806, body tie region 808, and contacts 810-814.

In the embodiment depicted in FIG. 8, body region 802 is formed as a P-type well dopant implanted region in substrate 116 (FIG. 1), adjacent to sidewall 112. The body region 802 may be characterized as a P− (minus) body region. After body region 802 is formed, N-type dopants are implanted to form source and drain regions 804 and 806 respectively. Source and drain regions 804 and 806 may be characterized as N+ (plus) source/drain regions, respectively. Source region 804 is formed adjacent to sidewall 112 and drain region 806 is formed adjacent to sidewall 114. P-type dopant is implanted to form body tie region 808 which allows electrical connectivity with body region 802. Body tie region 808 may be characterized as a P+ (plus) body tie region. Body tie region 808 abuts source region 804.

At top surface 702, dielectric region 608 is patterned and etched to expose portions of gate electrode 604, source field plate 302, drain field plate 304, source and drain regions 804 and 806, and body tie region 808. After the dielectric region 608 is patterned and etched, contacts 810-814 are formed allowing electrical connectivity to the gate electrode 604, source and drain field plates 302 and 304, source and drain regions 804 and 806, and body tie region 808. Contacts may be formed from any suitable conductive material such as copper, gold, silver, aluminum, nickel, tungsten, and alloys thereof, for example. In this embodiment, contact 814 is shared forming contact with both gate electrode 604 and source side field plate 302. In some embodiments, a first contact may be formed to contact gate electrode 604 and a second contact may be formed to contact source field plate 302 where the first and second contacts are separate from each other. In this arrangement, source field plate 302 may be connected to receive a voltage signal different from that which may be provided at gate electrode 604, for example (see FIG. 42).

Figures 9, 10:
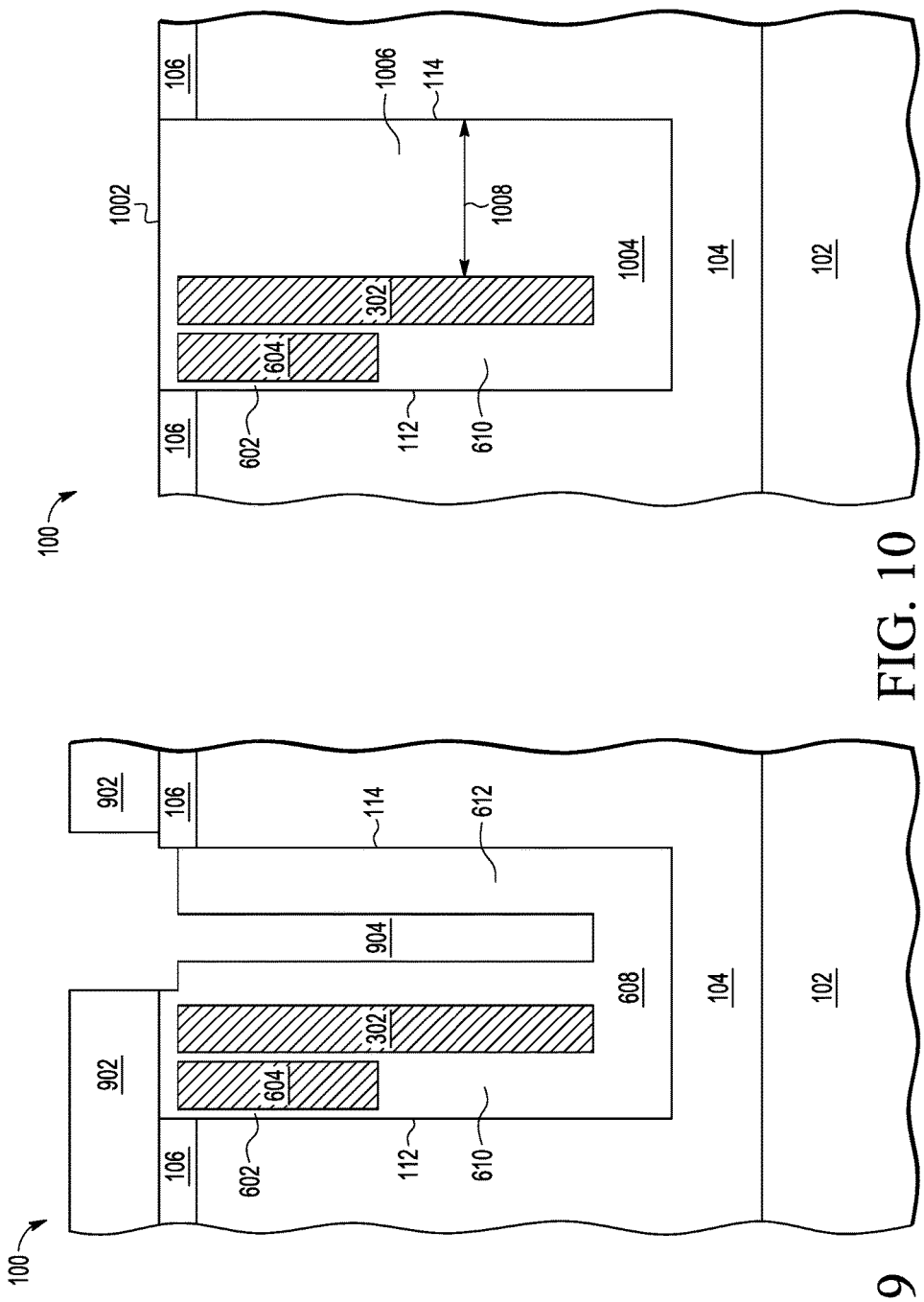
FIG. 9 through FIG. 12 illustrate, in simplified cross-sectional view, stages of manufacture of exemplary FET in accordance with another embodiment of the present invention.

FIG. 9 through FIG. 12 illustrate, in simplified cross-sectional views, various stages of manufacture of an exemplary semi-vertical field effect transistor (FET) 100 formed in accordance with another embodiment of the present invention. In this embodiment, stages of manufacture of an exemplary semi-vertical field effect transistor (FET) 100 depicted in FIG. 1 through FIG. 6 remain the same. For example, FIG. 9 depicts a stage of manufacture subsequent to FIG. 6 in another embodiment.

FIG. 9 illustrates in a simplified cross-sectional view, exemplary semi-vertical FET 100 at a subsequent stage of manufacture in accordance with an embodiment of the present invention. After planarizing top surface 606 and sealing the exposed gate electrode 604 and source side field plate 302 as depicted in FIG. 6, a photoresist material 902 is deposited and patterned. A first etch process is performed to expose a top portion of field plate 304. Dielectric region 608 is etched using an anisotropic etch process sufficient to expose a top portion of field plate 304. A second etch process is performed to remove a remaining portion field plate 304. The drain side field plate 304 is etched using an isotropic etch process (e.g. $SF_6$ plasma etch) sufficient to remove field plate 304, and thus forms field plate cavity region 904. Hard mask 106 and dielectric 608 provide tolerance for alignment of the patterned photoresist material 902.

FIG. 10 illustrates in a simplified cross-sectional view, exemplary semi-vertical FET 100 at a subsequent stage of manufacture in accordance with an embodiment of the present invention. After removing field plate 304, a dielectric material is deposited to fill field plate cavity region 904. In this embodiment, the field plate cavity region 904 is filled with a deposited oxide material such as TEOS, for example. At this stage of manufacture, patterned photoresist material 902 (FIG. 9) is removed. Field plate cavity region 904 is substantially filled with dielectric material forming dielectric region 1004. After field plate cavity region 904 is filled with dielectric material, top surface 1002 is planarized (e.g. by way of CMP process). Dielectric region 1004 substantially surrounds gate electrode 604 and source field plate 302.

Dielectric region 1004 includes source side dielectric thickness 508 and bottom side dielectric thickness 510 (FIG. 5), and drain side dielectric thickness 1008. Here drain side dielectric thickness 1008 is substantially equal to the sum of intermediate dielectric thickness 512, drain side dielectric thickness 514, and drain side field plate thickness 516 as depicted in FIG. 5. In this embodiment, drain side dielectric region 1006 is substantially thicker than source side dielectric 610 region. Because the drain side dielectric 1006 is thicker than the source side dielectric 610, a higher breakdown voltage and lower RonA can be achieved for the semi-vertical FET 100. In this embodiment, drain side dielectric thickness 1008 may have a thickness value in a range of 0.6-1.2 microns, and source side dielectric thickness 508 may have a thickness value in a range of 0.2-0.4 microns for a given semi-vertical FET 100 voltage specification, for example. Other embodiments may include other thickness values for thicknesses 508 and 1008 based on semi-vertical FET 100 voltage specifications.

Figures 11, 12:
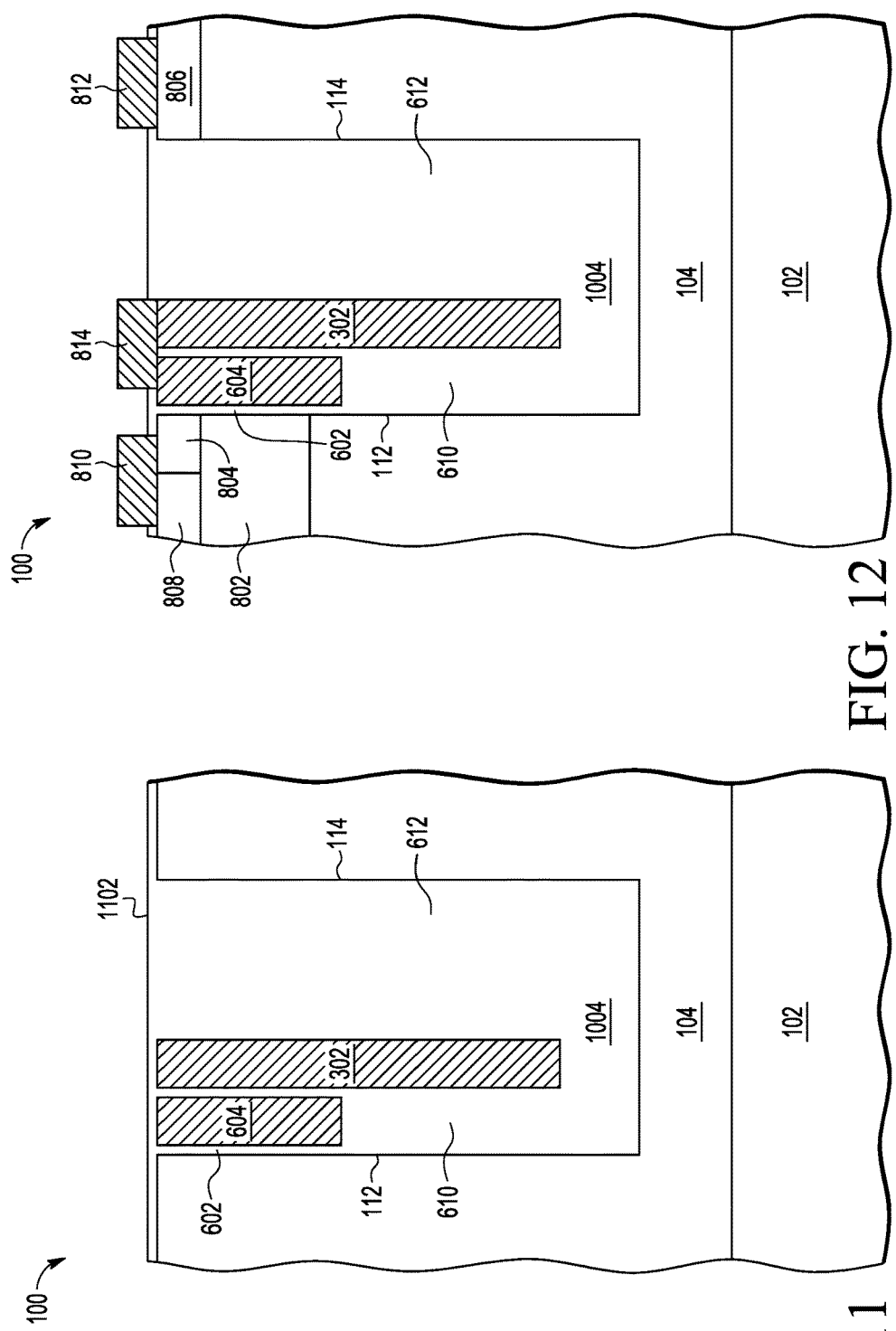

FIG. 11 illustrates in a simplified cross-sectional view, exemplary semi-vertical FET 100 at a subsequent stage of manufacture in accordance with an embodiment of the present invention. After planarizing top surface 1002 as depicted in FIG. 10, nitride hard mask material 106 is removed and top portions of gate electrode and field plate regions 604 and 302 are recessed. After removing hard mask 106 and recessing gate electrode and field plate regions 604 and 302, an oxide layer is grown or deposited at the top surface 1102, sealing exposed portions of the gate electrode and field plate regions 604 and 302. Dielectric region 1004 surrounds other portions of gate electrode 604 and source field plate 302.

FIG. 12 illustrates in a simplified cross-sectional view, exemplary semi-vertical FET 100 at a subsequent stage of manufacture in accordance with an embodiment of the present invention. At this stage of manufacture, semi-vertical FET 100 includes body region 802, source and drain regions 804 and 806, body tie region 808, and contacts 810-814.

Body region 802 is formed as a P-type well dopant implanted region in substrate 116 (FIG. 1), adjacent to sidewall 112. The body region 802 may be characterized as a P− (minus) body region. After body region 802 is formed, N-type dopants are implanted to form source and drain regions 804 and 806 respectively. Source and drain regions 804 and 806 may be characterized as N+ (plus) source/drain regions. Source region 804 is formed adjacent to sidewall 112 and drain region 806 is formed adjacent to sidewall 114. P-type dopant is implanted to form body tie region 808 which allows electrical connectivity with body region 802. Body tie region 808 may be characterized as a P+ (plus) body tie region. Body tie region 808 abuts source region 804.

At top surface 1102, dielectric region 1004 is patterned and etched to expose portions of gate electrode 604 and source field plate 302, source and drain regions 804 and 806, and body tie region 808. After the dielectric region 1004 is patterned and etched, contacts 810-814 are formed allowing electrical connectivity to the gate electrode 604, source field plate 302, source and drain regions 804 and 806, and body tie region 808. Contacts may be formed from any suitable conductive material such as copper, gold, silver, aluminum, nickel, tungsten, and alloys thereof, for example. In some embodiments, contacts may be formed including a silicide process. In this embodiment, contact 814 is shared allowing electrical connectivity with both gate electrode 604 and source field plate 302. In some embodiments, a first contact may be formed to contact gate electrode 604 and a second contact may be formed to contact source field plate 302 where the first and second contacts are separate from each other. In this arrangement, source field plate 302 may be connected to receive a signal different from that which may be provided at gate electrode 604, for example (see FIG. 43).

Figure 13:
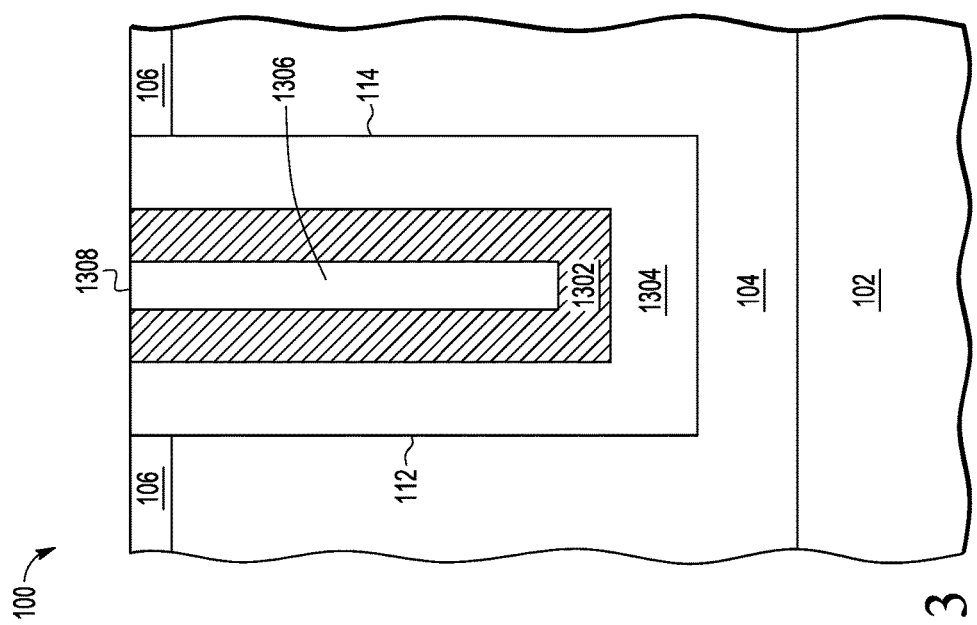

FIG. 13 through FIG. 19 illustrate, in simplified cross-sectional views, various stages of manufacture of an exemplary semi-vertical field effect transistor (FET) 100 formed in accordance with another embodiment of the present invention. In this embodiment, stages of manufacture of an exemplary semi-vertical field effect transistor (FET) 100 depicted in FIG. 1 through FIG. 2 remain the same. For example, FIG. 13 depicts a stage of manufacture subsequent to FIG. 2 in another embodiment.

FIG. 13 illustrates in a simplified cross-sectional view, exemplary semi-vertical FET 100 at a subsequent stage of manufacture in accordance with an embodiment of the present invention. After depositing dielectric layer 202 and conductive layer 204 (FIG. 2), cavity 206 is filled with a dielectric material 1306. In this embodiment, the cavity 206 is filled with a deposited oxide such as TEOS for example. After cavity 206 is filled with dielectric material 1306, a top surface is subjected to a planarization process forming a planar top surface 1308. In this embodiment, the planarization process may include a chemical-mechanical planarization (CMP) process, for example. In other embodiments, the planarization process may include a wet etch process. After the planarization process, a U-shaped or V-shaped field plate region 1302 remains from the conductive layer 204. An oxidation process is performed at this stage providing an oxide seal on exposed portions of field plate region 1302. Dielectric region 1304 substantially surrounds other portions of field plate region 1302.

Figure 14:
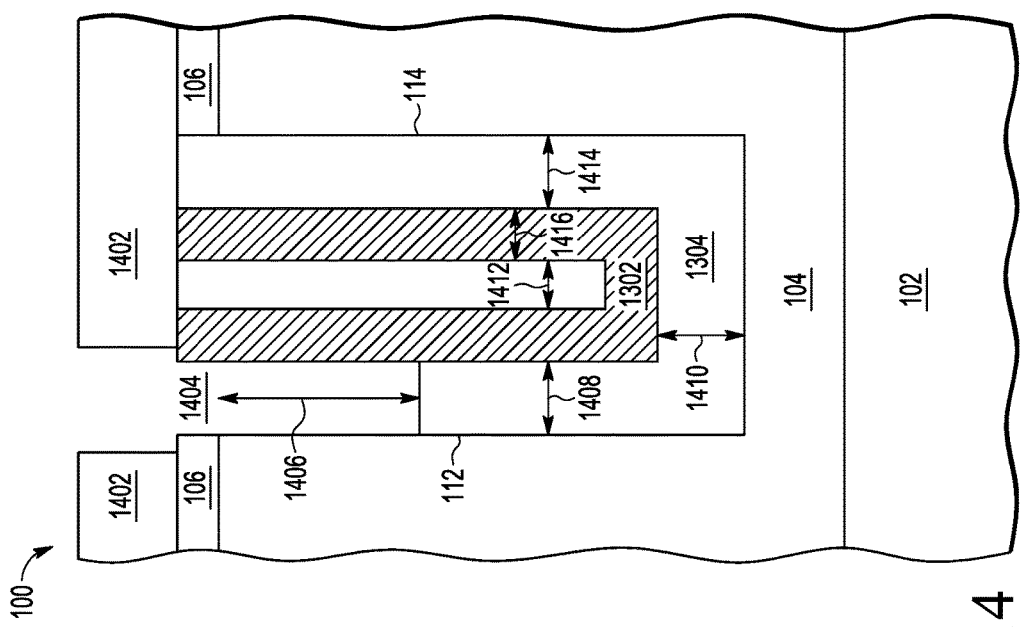
FIG. 13 through FIG. 19 illustrate, in simplified cross-sectional view, stages of manufacture of exemplary FET formed in accordance with another embodiment of the present invention.

FIG. 14 illustrates in a simplified cross-sectional view, exemplary semi-vertical FET 100 at a subsequent stage of manufacture in accordance with an embodiment of the present invention. After planarizing top surface 1308 and sealing the exposed portions of field plate region 1302 as depicted in FIG. 13, a photoresist material 1402 is deposited and patterned. A portion of dielectric region 1304 is subsequently etched to a depth 1406 forming a gate cavity region 1404. The dielectric region 1304 may be etched by way of wet or dry etch processes or combinations thereof to form gate cavity 1404. In this embodiment, the depth 1406 dimension corresponds approximately to a transistor gate length of the semi-vertical FET 100. Hard mask 106 and field plate region 1302 provide tolerance for alignment of the patterned photoresist material 1402.

Dielectric region 1304 includes source side dielectric thickness 1408, bottom side dielectric thickness 1410, intermediate dielectric thickness 1412, drain side dielectric thickness 1414, and field plate region thickness 1416. In this embodiment, thicknesses 1408, 1410, and 1414 may each have substantially a same thickness value in a range of 0.2-0.4 microns, thickness 1412 may have a thickness value in a range of 0.3-0.5 microns, and thickness 1416 may have a thickness value in a range of 0.15-0.35 microns for a given semi-vertical FET 100 voltage specification, for example. Other embodiments may include other thickness values for thicknesses 1408-1416 based on semi-vertical FET 100 voltage specifications.

Figure 15:
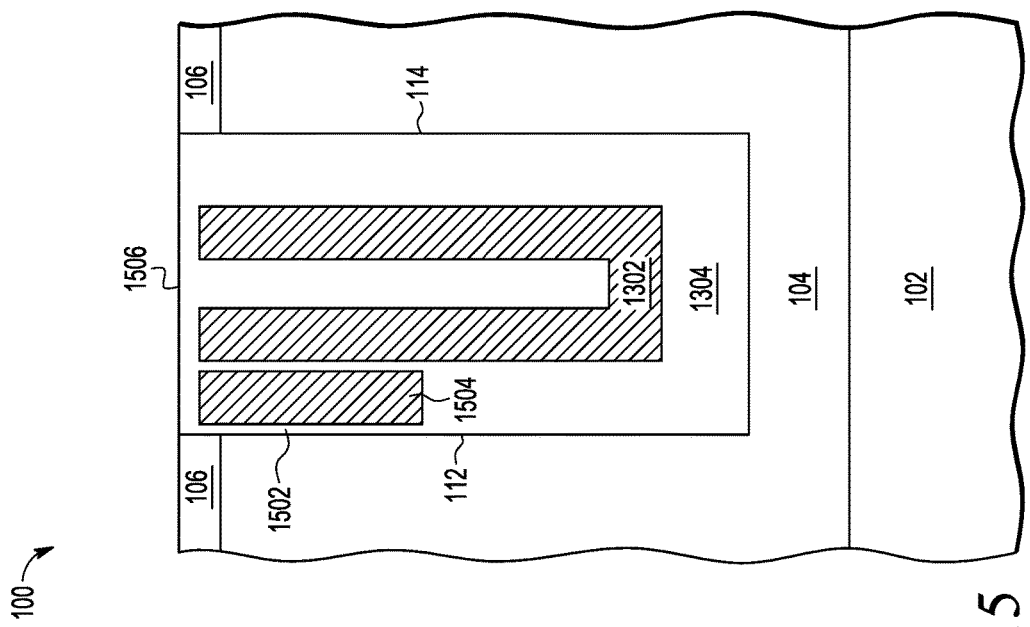

FIG. 15 illustrates in a simplified cross-sectional view, exemplary semi-vertical FET 100 at a subsequent stage of manufacture in accordance with an embodiment of the present invention. After forming gate cavity region 1404 (FIG. 14), a gate electrode 1504 is formed. At this stage of manufacture, patterned photoresist material 1402 (FIG. 14) is removed. A gate dielectric region 1502 is formed on the sidewall 112 and other surfaces of gate cavity region 1404. For example, gate dielectric region 1502 may be formed by growing an oxide material to a predetermined thickness. After forming gate dielectric region 1502, a conductive material (e.g. polysilicon) is deposited such that a remaining portion of the gate cavity region 1404 is substantially filled to form gate electrode 1504. Gate electrode 1504 is formed such that it is separated from the sidewall 112 by gate dielectric region 1502. After deposition of the conductive material to form gate electrode 1504, a top surface 1506 is planarized or etched back. An oxide layer is grown to seal exposed portions of the gate electrode 1504. Oxide region 1304 surrounds other portions of gate electrode 1504, and field plate region 1302.

Figure 16:
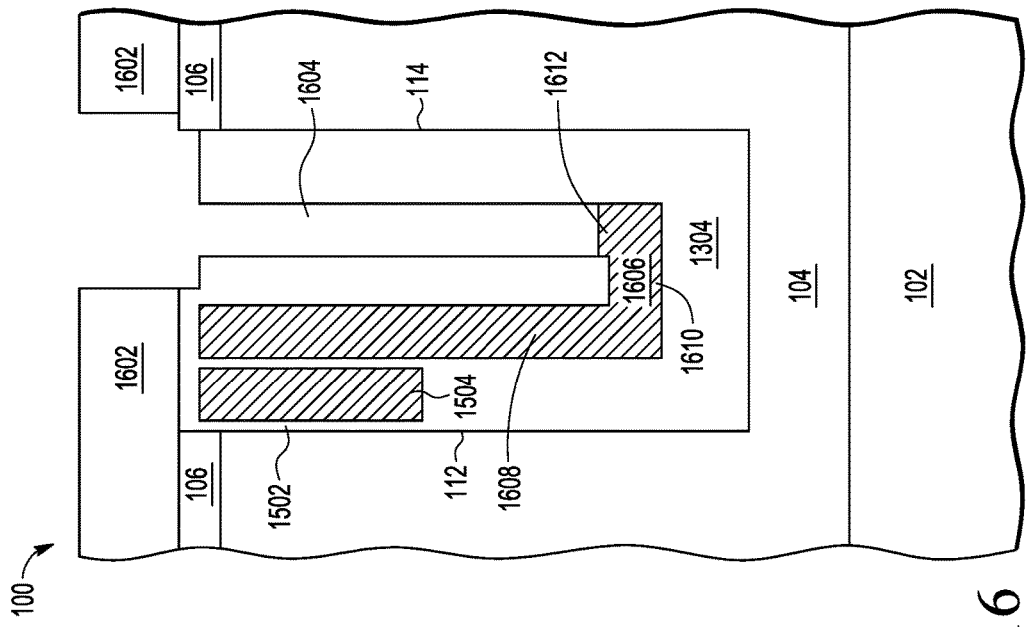

FIG. 16 illustrates in a simplified cross-sectional view, exemplary semi-vertical FET 100 at a subsequent stage of manufacture in accordance with an embodiment of the present invention. After forming gate electrode 1504, drain side of field plate region 1302 is etched to form drain side field plate cavity 1604. At this stage, a photoresist material 1602 is deposited and patterned. A portion of field plate region 1302 is subsequently etched to a suitable depth forming a drain side field plate cavity region 1604. Hard mask 106 and dielectric 1304 provide tolerance for alignment of the patterned photoresist material 1602. The portion of field plate region 1302 may be etched by way of wet or dry etch processes or combinations thereof to form drain side field plate cavity 1604. In this embodiment, the remaining portion of field plate region 1302 after etching forms a J-shaped field plate region 1606. The J-shaped field plate region 1606 includes a vertical portion 1608 having an end connected to an end of a lateral portion 1610. A smaller second vertical portion 1612 may be connected at a second end of the lateral portion 1610.

Figure 17:
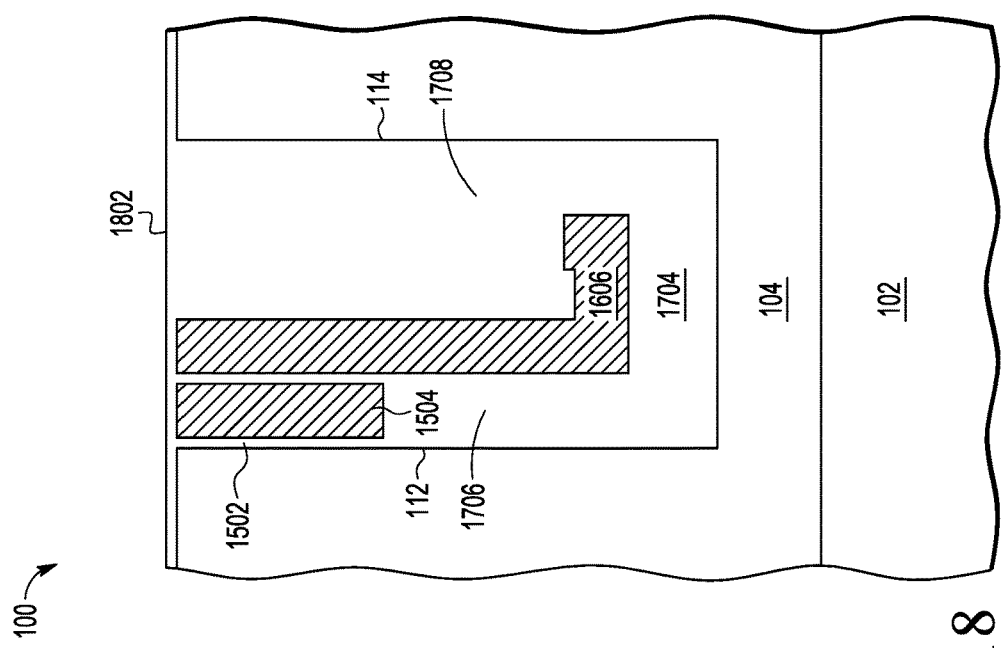

FIG. 17 illustrates in a simplified cross-sectional view, exemplary semi-vertical FET 100 at a subsequent stage of manufacture in accordance with an embodiment of the present invention. After forming J-shaped field plate region 1606, a dielectric material is deposited to fill drain side field plate cavity region 1604. In this embodiment, the drain side field plate cavity region 1604 is filled with a deposited oxide material such as TEOS, for example. At this stage of manufacture, patterned photoresist material 1602 (FIG. 16) is removed. Drain side field plate cavity region 1604 is substantially filled with dielectric material forming dielectric region 1704. After drain side field plate cavity region 1604 is filled with dielectric material, top surface 1702 is planarized (e.g. by way of CMP process). Dielectric region 1704 substantially surrounds gate electrode 1504 and J-shaped field plate region 1606. Dielectric region 1704 includes a source side dielectric region 1706 and a drain side dielectric region 1708. The source side dielectric region 1706 is located between sidewall 112 and vertical portion 1608 of J-shaped field plate region 1606, and the drain side dielectric region 1708 is located between sidewall 114 and vertical portion 1608 of J-shaped field plate region 1606.

Dielectric region 1704 includes source side dielectric thickness 1408 and bottom side dielectric thickness 1410 (FIG. 14), and drain side dielectric thickness 1710. Here drain side dielectric thickness 1710 is substantially equal to the sum of intermediate dielectric thickness 1412, drain side dielectric thickness 1414, and drain side portion thickness 1416 of field plate region 1302 field plate as depicted in FIG. 14. In this embodiment, drain side dielectric 1708 is substantially thicker than source side dielectric 1706. For example, drain side dielectric thickness 1710 may have a thickness value about three time the thickness value of source side dielectric thickness 1408. Because the drain side dielectric 1708 is thicker than the source side dielectric 1706, a higher breakdown voltage and lower RonA can be achieved for the semi-vertical FET 100.

Figure 18:
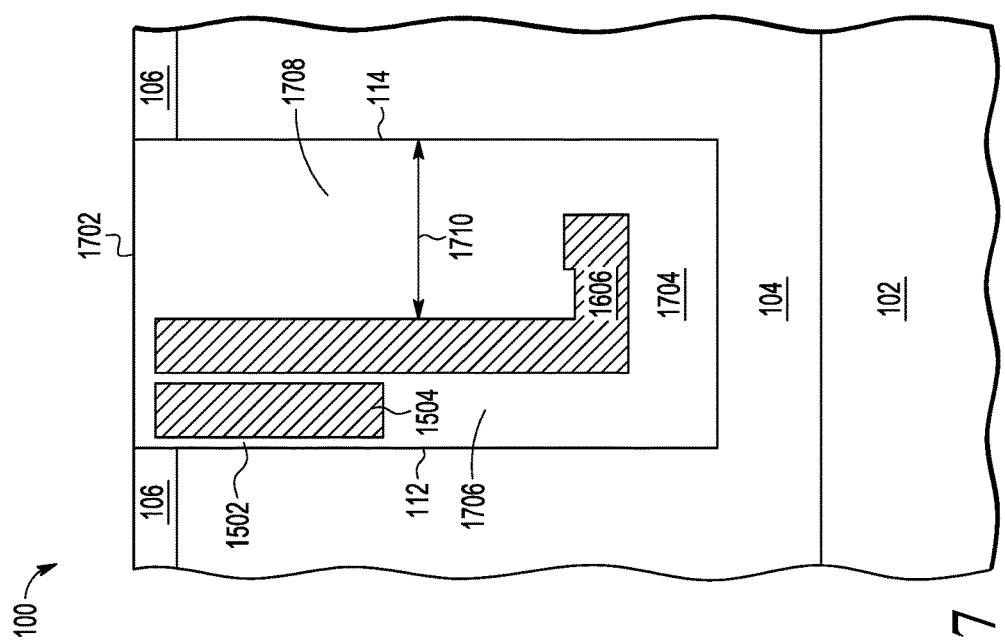

FIG. 18 illustrates in a simplified cross-sectional view, exemplary semi-vertical FET 100 at a subsequent stage of manufacture in accordance with an embodiment of the present invention. After planarizing top surface 1702 as depicted in FIG. 17, nitride hard mask material 106 is removed and top portions of gate electrode 1504 and field plate region 1606 are recessed. After removing hard mask 106 and recessing gate electrode 1504 and field plate region 1606, an oxide layer is grown or deposited at the top surface 1802, sealing exposed portions of the gate electrode 1504 and field plate region 1606. Dielectric region 1704 surrounds other portions of gate electrode 1504 and J-shaped field plate 1606.

Figure 19:
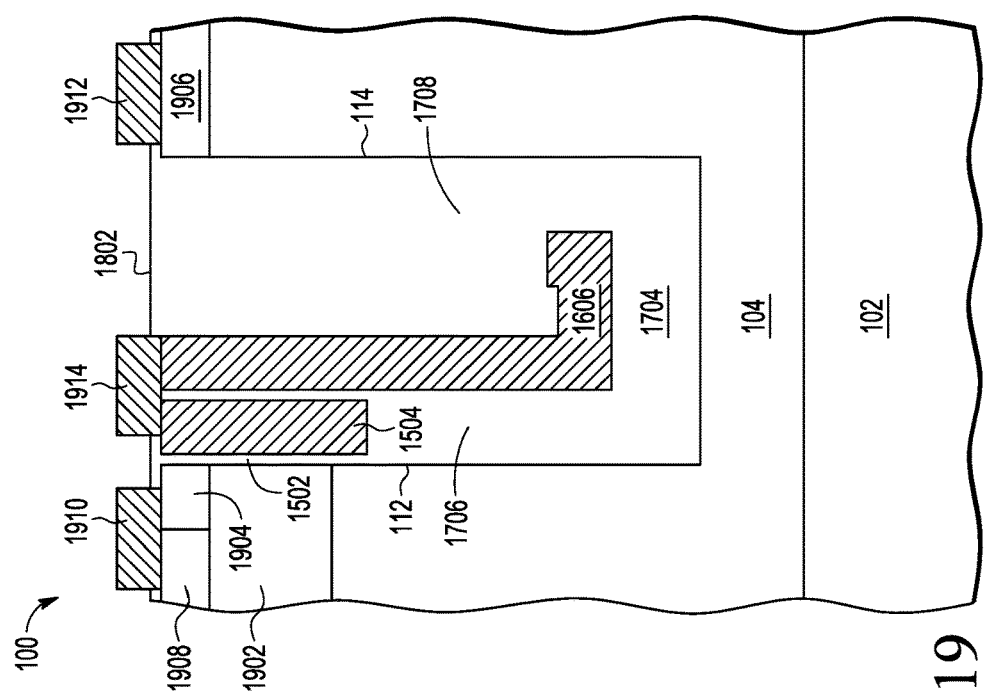

FIG. 19 illustrates in a simplified cross-sectional view, exemplary semi-vertical FET 100 at a subsequent stage of manufacture in accordance with an embodiment of the present invention. At this stage of manufacture, semi-vertical FET 100 includes body region 1902, source and drain regions 1904 and 1906, body tie region 1908, and contacts 1910-1914.

Body region 1902 is formed as a P-type well dopant implanted region in substrate 116 (FIG. 1) having at least a portion of the implanted region adjacent to sidewall 112. The body region 1902 may be characterized as a P– (minus) body region. After body region 1902 is formed, N-type dopants are implanted to form source and drain regions 1904 and 1906 respectively. Source and drain regions 1904 and 1906 may be characterized as N+ (plus) source/drain regions. Source region 1904 is formed having at least a portion of the source implanted region adjacent to sidewall 112 and drain region 1906 is formed having at least a portion of the drain implanted region adjacent to sidewall 114. P-type dopant is implanted to form body tie region 808 which allows electrical connectivity with body region 1902. Body tie region 1908 may be characterized as a P+ (plus) body tie region. At least a portion of body tie region 1908 abuts a portion of source region 1904.

At top surface 1802, dielectric region 1704 is patterned and etched to expose portions of gate electrode 1504 and J-shaped field plate 1606, source and drain regions 1904 and 1906, and body tie region 1908. After the dielectric region 1704 is patterned and etched, contacts 1910-1914 are formed allowing electrical connectivity to the gate electrode 1504, J-shaped field plate 1606, source and drain regions 1904 and 1906, and body tie region 1908. Contacts may be formed from any suitable conductive material such as copper, gold, silver, aluminum, nickel, tungsten, and alloys thereof, for example. In some embodiments, contacts may be formed including a silicide process. In this embodiment, contact 1914 is shared allowing electrical connectivity with both gate electrode 1504 and J-shaped field plate 1606. In some embodiments, a first contact may be formed to contact gate electrode 1504 and a second contact may be formed to contact J-shaped field plate 1606 where the first and second contacts are separate from each other. In this arrangement, J-shaped field plate 1606 may be connected to a voltage signal different from a voltage signal provided at gate electrode 1504, for example (see FIG. 44).

Figure 20:
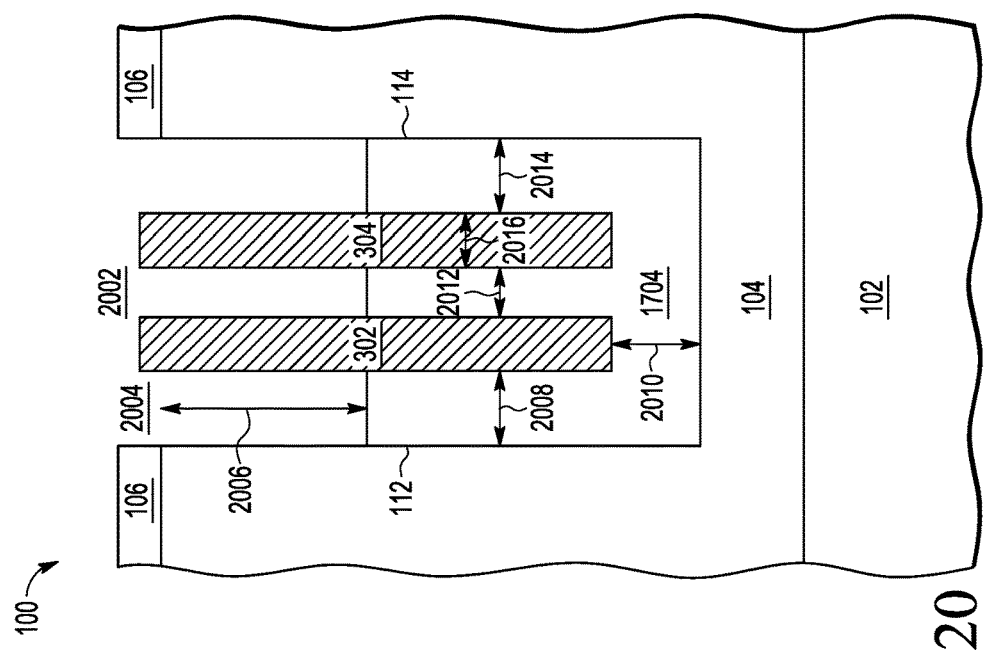

FIG. 20 through FIG. 25 illustrate, in simplified cross-sectional views, various stages of manufacture of an exemplary semi-vertical field effect transistor (FET) 100 formed in accordance with another embodiment of the present invention. In this embodiment, stages of manufacture of an exemplary semi-vertical field effect transistor (FET) 100 depicted in FIG. 1 through FIG. 4 remain the same. For example, FIG. 20 depicts a stage of manufacture subsequent to FIG. 4 in another embodiment.

FIG. 20 illustrates in a simplified cross-sectional view, exemplary semi-vertical FET 100 at a subsequent stage of manufacture in accordance with an embodiment of the present invention. After forming and sealing field plates 302 and 304 (FIG. 4), a portion of dielectric region 404 is etched to a depth 2006 forming a set of cavity regions 2002. The set of cavity regions 2002 is formed as three cavities such as gate cavity region 2004 formed between sidewall 112 and vertical field plate 302. The dielectric region 404 may be etched by way of a blanket wet or dry etch processes or combinations thereof to form the set of cavity regions 2002. In this embodiment, the depth 2006 dimension corresponds approximately to a transistor gate length of the semi-vertical FET 100.

Dielectric region 404 includes source side dielectric thickness 2008, bottom side dielectric thickness 2010, intermediate dielectric thickness 2012, drain side dielectric thickness 2014, and field plate region thickness 2016. In this embodiment, thicknesses 2008, 2010, and 2014 may each have substantially a same thickness value in a range of 0.2-0.4 microns, thickness 2012 may have a thickness value in a range of 0.3-0.5 microns, and thickness 2016 may have a thickness value in a range of 0.15-0.35 microns for a given semi-vertical FET 100 voltage specification, for example. Other embodiments may include other thickness values for thicknesses 508-516 based on semi-vertical FET 100 voltage specifications.

Figure 21:
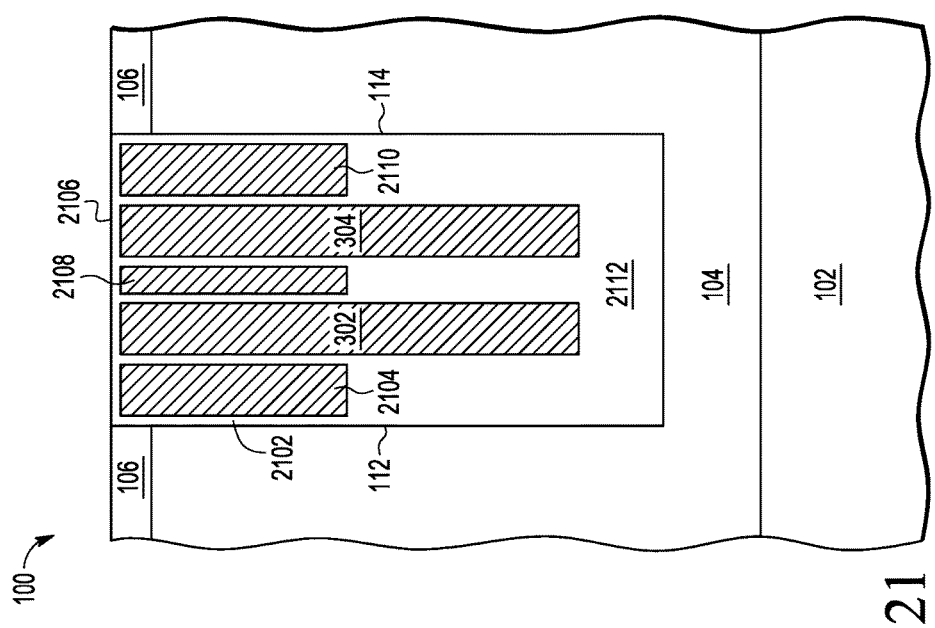

FIG. 21 illustrates in a simplified cross-sectional view, exemplary semi-vertical FET 100 at a subsequent stage of manufacture in accordance with an embodiment of the present invention. After forming set of cavity regions 2002 (FIG. 20), a gate electrode 2104 is formed. At this stage of manufacture, a gate dielectric region 2102 is formed on the sidewall 112 in gate cavity region 2004 and on other exposed surfaces of the set of cavity regions 2002. For example, gate dielectric region 2102 may be formed by growing an oxide material to a predetermined thickness. After forming gate dielectric region 2102 in gate cavity region 2004 and on other exposed surfaces of the set of cavity regions 2002, a conductive material (e.g. polysilicon) is deposited such that remaining cavity portions of the set of cavity regions 2002 including gate cavity region 2004 are substantially filled. Gate electrode 2104 is formed such that it is separated from the sidewall 112 by gate dielectric region 2102. After deposition of the conductive material to form gate electrode 2104 and conductive regions 2108 and 2110, a top surface 2106 is planarized. An oxide layer is grown to seal exposed portions of the gate electrode 2104 and regions 2108 and 2110. Dielectric region 2112 surrounds other portions of gate electrode 2104, and conductive regions 2108 and 2110.

Figure 22:
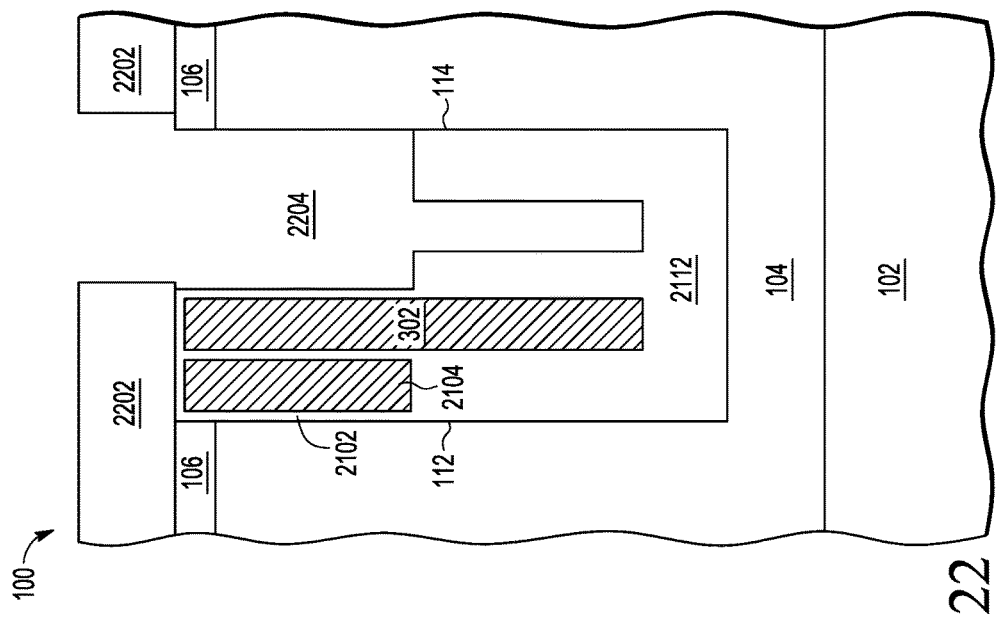

FIG. 22 illustrates in a simplified cross-sectional view, exemplary semi-vertical FET 100 at a subsequent stage of manufacture in accordance with an embodiment of the present invention. After forming gate electrode 2104 and conductive regions 2108 and 2110, drain side of field plate region 304 and conductive regions 2108 and 2110 are removed forming drain side cavity 2204. At this stage, a photoresist material 2202 is deposited and patterned. Field plate region 304 and conductive regions 2108 and 2110 are subsequently etched to substantially remove field plate region 304 and conductive regions 2108 and 2110, thus forming drain side cavity region 2204. The field plate region 304 and conductive regions 2108 and 2110 may be etched by way of wet or dry etch processes or combinations thereof to form drain side cavity 2204. In this embodiment, dielectric region 2112 is etched anisotropically to expose portions of field plate region 304 and conductive regions 2108 and 2110. The (polysilicon) field plate region 304 and conductive regions 2108 and 2110 are etched isotropically with a high selectivity etchant (e.g., SF6 plasma).

Figures 23, 24:
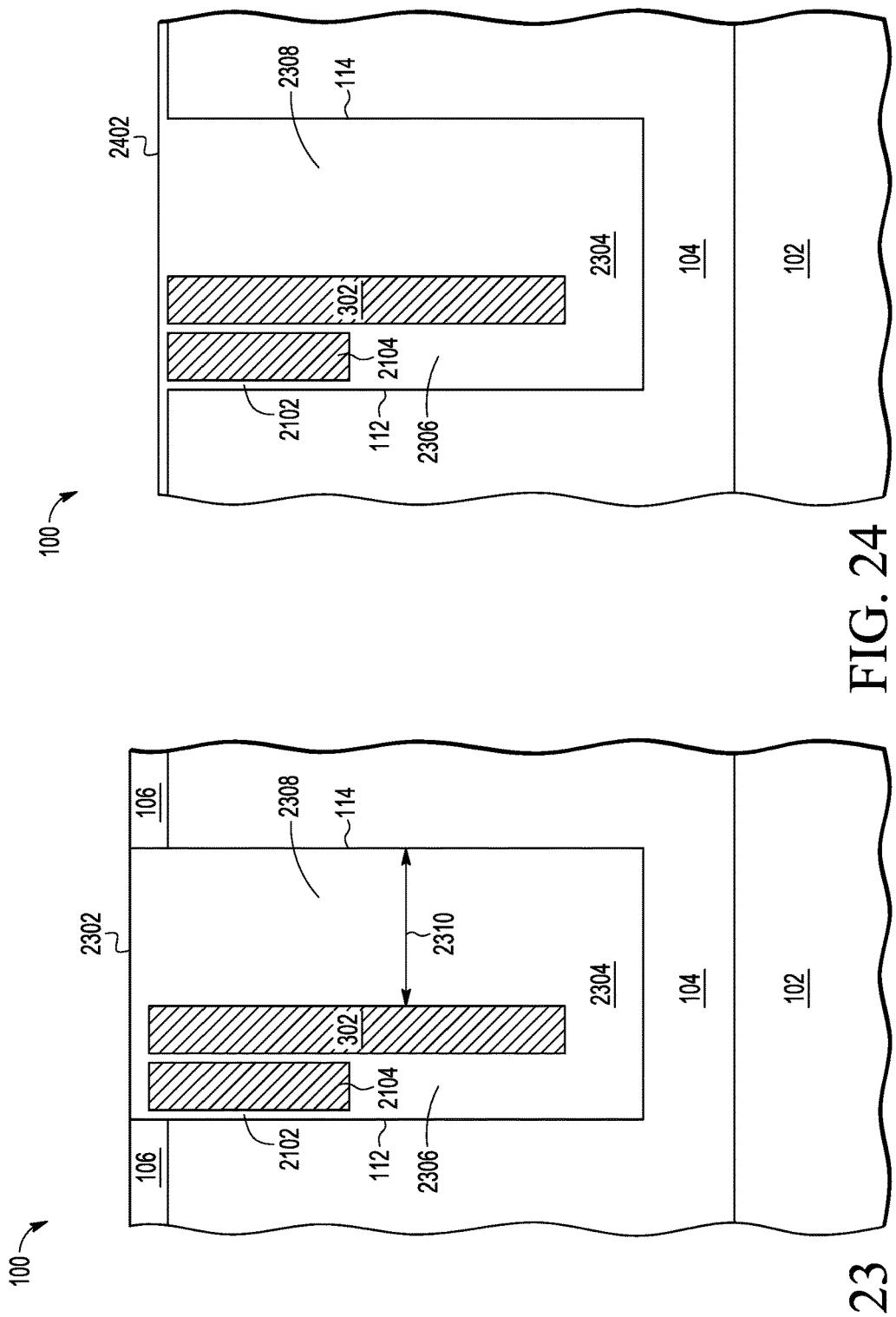

FIG. 23 illustrates in a simplified cross-sectional view, exemplary semi-vertical FET 100 at a subsequent stage of manufacture in accordance with an embodiment of the present invention. After removing field plate region 304 and conductive regions 2108 and 2110, a dielectric material is deposited to fill drain side cavity region 2204. In this embodiment, the drain side cavity region 2204 is filled with a deposited oxide material such as TEOS, for example. At this stage of manufacture, patterned photoresist material 2202 (FIG. 22) is removed. Drain side cavity region 2204 is substantially filled with dielectric material forming dielectric region 2304. After drain side cavity region 2204 is filled with dielectric material, top surface 2302 is planarized (e.g. by way of CMP process). Dielectric region 2304 substantially surrounds gate electrode 2104 and vertical field plate region 302. Dielectric region 2304 includes a source side dielectric region 2306 and a drain side dielectric region 2308. The source side dielectric region 2306 is located between sidewall 112 and vertical field plate region 302, and the drain side dielectric region 2308 is located between sidewall 114 and vertical field plate region 302.

Dielectric region 2304 includes source side dielectric thickness 2008 and bottom side dielectric thickness 2010 (FIG. 20), and drain side dielectric thickness 2310. Here drain side dielectric thickness 2310 is substantially equal to the sum of intermediate dielectric thickness 2012, drain side dielectric thickness 2014, and drain side portion thickness 2016 of field plate region 304 field plate as depicted in FIG. 20. In this embodiment, drain side dielectric 2308 is substantially thicker than source side dielectric 2306. For example, drain side dielectric thickness 2310 may have a thickness value about three time the thickness value of source side dielectric thickness 2008. Because the drain side dielectric 2308 is thicker than the source side dielectric 2306, a higher breakdown voltage and lower RonA can be achieved for the semi-vertical FET 100.

FIG. 24 illustrates in a simplified cross-sectional view, exemplary semi-vertical FET 100 at a subsequent stage of manufacture in accordance with an embodiment of the present invention. After planarizing top surface 2302 as depicted in FIG. 23, nitride hard mask material 106 is removed and top portions of gate electrode 2104 and field plate region 302 are recessed. After removing hard mask 106 and recessing gate electrode 2104 and field plate region 302, an oxide layer is grown or deposited at the top surface 2402, sealing exposed portions of the gate electrode 2104 and field plate region 302. Dielectric region 2304 surrounds other portions of gate electrode 2104 and field plate region 302.

Figures 25, 26:
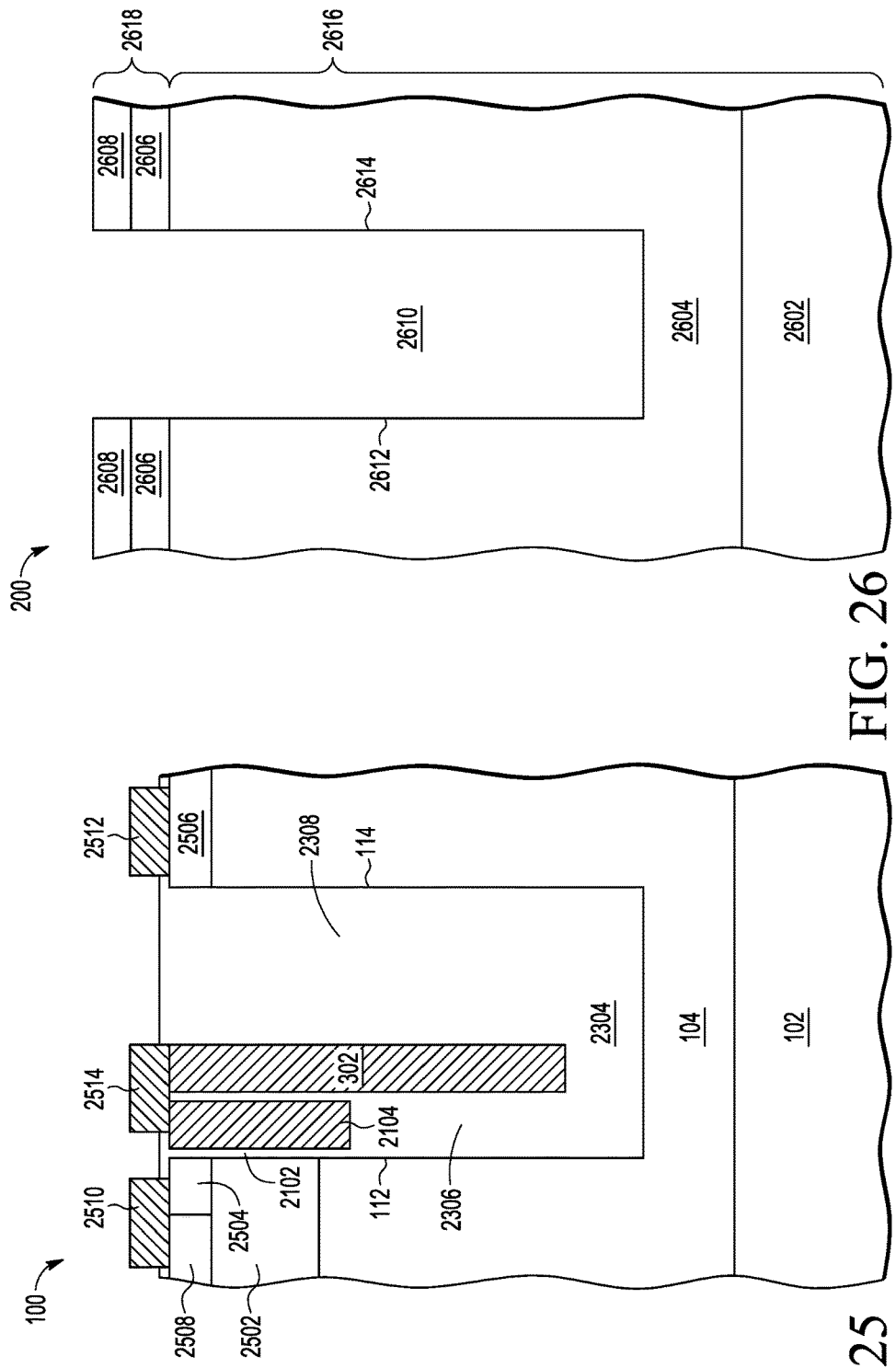

FIG. 25 illustrates in a simplified cross-sectional view, exemplary semi-vertical FET 100 at a subsequent stage of manufacture in accordance with an embodiment of the present invention. At this stage of manufacture, semi-vertical FET 100 includes body region 2502, source and drain regions 2504 and 2506, body tie region 2508, and contacts 2510-2514.

Body region 2502 is formed as a P-type well dopant implanted region in substrate 116 (FIG. 1) having at least a portion of the implanted region adjacent to sidewall 112. The body region 2502 may be characterized as a P− (minus) body region. After body region 2502 is formed, N-type dopants are implanted to form source and drain regions 2504 and 2506 respectively. Source and drain regions 2504 and 2506 may be characterized as N+ (plus) source/drain regions. Source region 2504 is formed having at least a portion of the source implanted region adjacent to sidewall 112 and drain region 2506 is formed having at least a portion of the drain implanted region adjacent to sidewall 114. P-type dopant is implanted to form body tie region 2508 which allows electrical connectivity with body region 2502. Body tie region 2508 may be characterized as a P+ (plus) body tie region. At least a portion of body tie region 2508 abuts a portion of source region 2504.

At top surface 2402, dielectric region 2304 is patterned and etched to expose portions of gate electrode 2104 and vertical field plate 302, source and drain regions 2504 and 2506, and body tie region 2508. After the dielectric region 2304 is patterned and etched, contacts 2510-2514 are formed allowing electrical connectivity to the gate electrode 2104, vertical field plate 302, source and drain regions 2504 and 2506, and body tie region 2508. Contacts may be formed from any suitable conductive material such as copper, gold, silver, aluminum, nickel, tungsten, and alloys thereof, for example. In this embodiment, contact 2514 is shared allowing electrical connectivity with both gate electrode 2104 and vertical field plate 302. In some embodiments, a first contact may be formed to contact gate electrode 2104 and a second contact may be formed to contact vertical field plate 302 where the first and second contacts are separate from each other. In this arrangement, vertical field plate 302 may be connected to a voltage signal different from a voltage signal provided at gate electrode 2104, for example (see FIG. 45).

FIG. 26 through FIG. 34 illustrate, in simplified cross-sectional views, various stages of manufacture of an exemplary semi-vertical field effect transistor (FET) 200 formed in accordance with another embodiment of the present invention.

FIG. 26 illustrates in a simplified cross-sectional view, exemplary semi-vertical FET 200 at a stage of manufacture in accordance with an embodiment of the present invention. At this stage, exemplary semi-vertical FET 200 includes a silicon based substrate 2616, a patterned hard mask 2618 formed over the substrate, and a trench 2610 formed in the substrate. Trench 2610 includes a first sidewall 2612 and a second sidewall 2614. In this embodiment, substrate 2616 includes a P-type doped silicon substrate 2602 and an N-type epitaxial layer 2604 formed at a top surface of the P-type doped silicon substrate 2602. Substrate 2616 may be formed from other suitable silicon-based substrates such as gallium arsenide, silicon germanium, silicon-on-insulator (SOI), silicon, monocrystalline silicon, the like, and combinations thereof, for example.

A pad oxide layer (not shown) is formed on substrate 2616. A nitride layer 2606 is formed on the pad oxide layer on substrate 2616, and an oxide layer 2608 is formed on the nitride layer 2606. The nitride/oxide layers together are patterned to form hard mask 2618. Photolithographic techniques and processing steps may be used to pattern, develop, and etch the nitride/oxide layers to form the hard mask 2618. In this embodiment, hard mask 2618 is formed over the epitaxial layer 2604 of substrate 2616. In this embodiment, trench 2610 is formed in substrate 2616 using hard mask 2618. Etch techniques such as reactive ion etching (RIE) may be employed to form trench 2610, for example.

Figure 27:
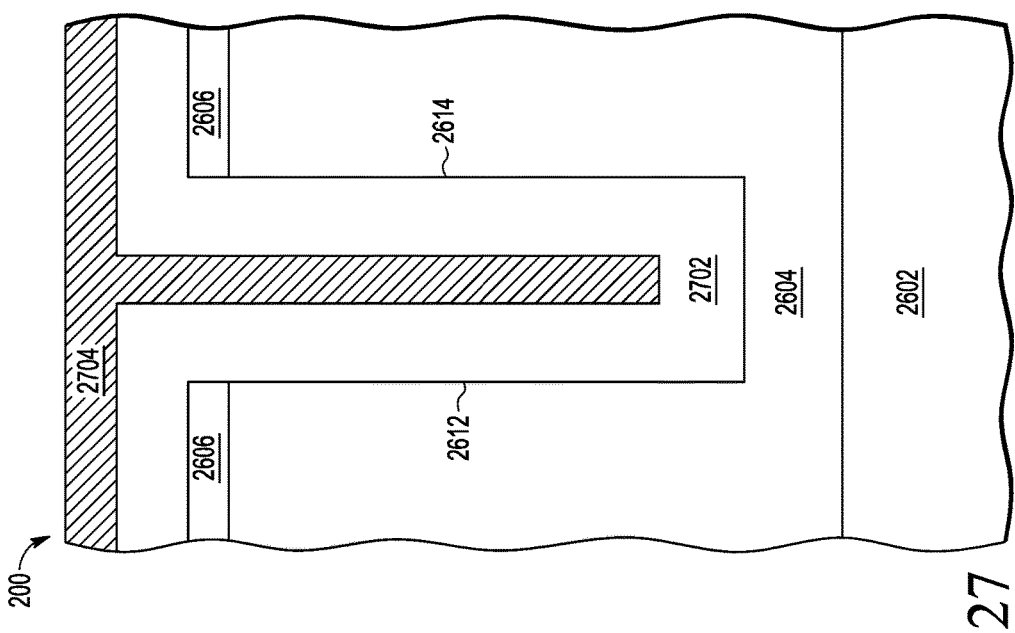

FIG. 27 illustrates in a simplified cross-sectional view, exemplary semi-vertical FET 200 at a subsequent stage of manufacture in accordance with an embodiment of the present invention. At this stage, a dielectric layer 2702 is formed covering the hard mask and trench 2610 surfaces. Dielectric layer 2702 essentially forms a liner layer at sidewalls 2612-2614 and bottom surfaces of trench 2610. In this embodiment, dielectric layer 2702 is formed from a grown oxide followed by a deposited oxide such as tetraethyl orthosilicate (TEOS). In some embodiments, dielectric layer 2702 may be formed from a material characterized as a high-K dielectric material such as hafnium dioxide or zirconium dioxide, for example. As used herein, the term high-K dielectric material refers to material having a dielectric constant value (K) greater than 3.9, the dielectric constant value for silicon dioxide (SiO2). After dielectric layer 2702 is formed, a vertical cavity remains between portions of dielectric layer 2702 formed over sidewall 2612 and sidewall 2614. A conductive field plate layer 2704 is subsequently formed on the dielectric layer 2702, filling the vertical cavity. In this embodiment, field plate layer 2704 is formed from a conductive material, such as polysilicon, deposited as a blanket layer covering dielectric layer 2702. In some embodiments, other conductive materials may be deposited as a field plate layer 2704 covering the oxide layer 2702 and filling the vertical cavity.

Figure 28:
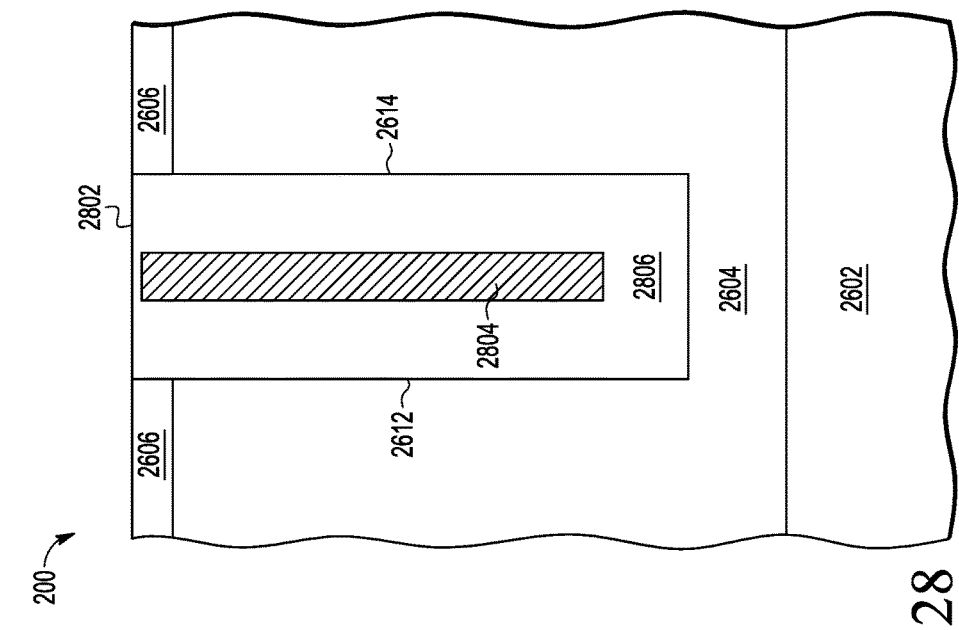

FIG. 28 illustrates in a simplified cross-sectional view, exemplary semi-vertical FET 200 at a subsequent stage of manufacture in accordance with an embodiment of the present invention. After conductive field plate layer 2704 is formed filling the vertical cavity, a top surface is subjected to a planarization process forming a planar top surface 2802. In this embodiment, the planarization process may include a chemical-mechanical planarization (CMP) process. In other embodiments, the planarization process may include a wet etch process. As a result, vertical field plate 2804 is formed. An oxidation process is performed at this stage, for example, to provide an oxide seal on exposed portions of the vertical field plate 2804. After exposed portions of field plate 2804 is sealed, dielectric region 2806 encloses vertical field plate 2804. In some embodiments, dielectric region 2806 may be characterized as a high-K dielectric region. In this embodiment, vertical field plate 2804 may be characterized as a vertical field plate 2804.

FIG. 29 illustrates in a simplified cross-sectional view, exemplary semi-vertical FET 200 at a subsequent stage of manufacture in accordance with an embodiment of the present invention. After planar top surface 2802 is formed and vertical field plate 2804 is enclosed by dielectric region 2806, dielectric region 2806 is etched to form drain side cavity region 2904. At this stage, a photoresist material 2902 is applied at a top surface of semi-vertical FET 200 and patterned. A drain side portion of dielectric region 2806 between vertical field plate 2804 and sidewall 2614 is subsequently etched to remove dielectric material forming drain side cavity region 2904. Source side dielectric region 2906 remains after forming drain side cavity region 2904. In some embodiments, source side dielectric region 2906 may be characterized as a high-K dielectric region.

FIG. 30 illustrates in a simplified cross-sectional view, exemplary semi-vertical FET 200 at a subsequent stage of manufacture in accordance with an embodiment of the present invention. At this stage of manufacture, a dielectric material is deposited to fill drain side cavity region 2904. In this embodiment, the drain side cavity region 2904 is filled with a deposited material different from source side dielectric region 2906. Patterned photoresist material 2902 (FIG. 29) is removed. Drain side cavity region 2904 is substantially filled with dielectric material forming dielectric region 3004. After drain side cavity region 2904 is filled with dielectric material, top surface 3002 is planarized (e.g. by way of CMP process). Dielectric regions 2906 and 3004 substantially surround vertical field plate region 2804. The source side dielectric region 2906 is located between sidewall 112 and vertical field plate region 2804. A portion of source side dielectric region 2906 may extend between a bottom portion of vertical field plate 2804 and bottom portion of trench 2610 (FIG. 26). The drain side dielectric region 3004 is located between sidewall 114 and vertical field plate region 2804.

In this embodiment, drain side dielectric region 3004 is formed from a low-K dielectric material such as fluorine-doped silicon dioxide, carbon-doped silicon dioxide, porous silicon dioxide, organic materials (e.g., benzocyclobutene), or air, for example. As used herein, the term low-K dielectric material refers to material having the dielectric constant value (K) less than 3.9, the dielectric constant value for SiO2. In some embodiments, the drain side dielectric region 3004 may be formed with varying low-K values. For example, a dopant may be implanted or diffused at a top surface of the drain side dielectric region causing a gradient affect in low-K values with lower low-K values near the top surface and higher low-K values further from the top surface. In some embodiments, source side dielectric 2906 may be formed from a high-K material and drain side dielectric 3004 may be formed from an oxide or low-K material. Because the drain side dielectric 3004 has a lower K value than the source side dielectric 2906, a higher breakdown voltage and lower RonA can be achieved for the semi-vertical FET 200.

Figure 31:
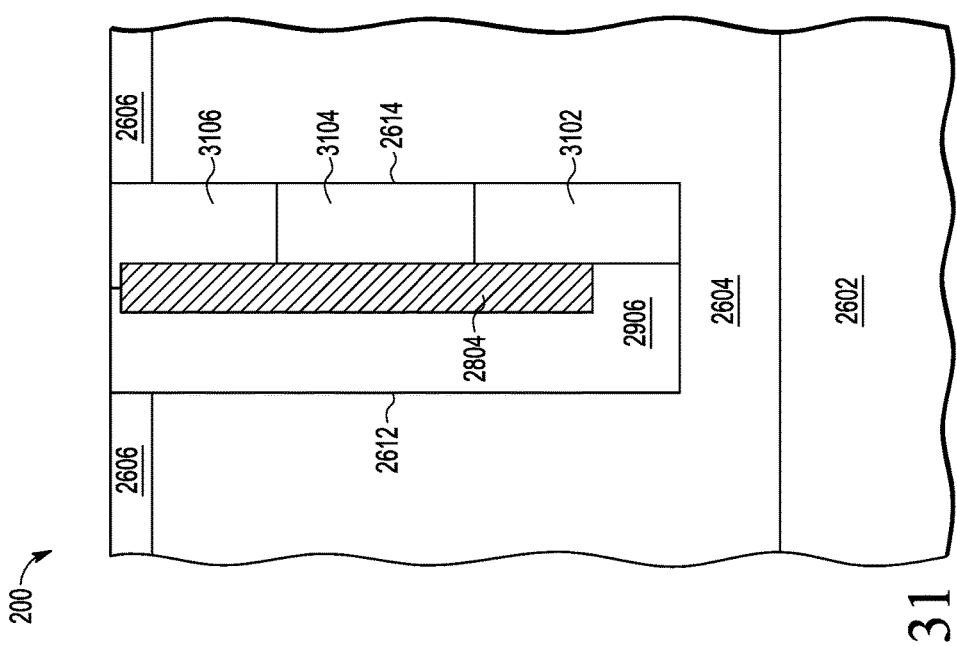

FIG. 31 illustrates in a simplified cross-sectional view, exemplary semi-vertical FET 200 at a stage of manufacture in accordance with another embodiment of the present invention. In this embodiment, FIG. 31 depicts an alternative stage of manufacture to the stage of manufacture depicted in FIG. 30. For example, at this stage of manufacture, a plurality of dielectric materials may be deposited to fill drain side cavity region 2904. In this embodiment, a plurality of dielectric materials (3102-3106) having different low-K values are deposited to fill the drain side cavity region 2904 rather than low-K material 3004 depicted in FIG. 30. For example, a first low-K dielectric material 3102 is deposited to fill a first portion of drain side cavity region 2904, a second low-K dielectric material 3104 is deposited to fill a second portion of drain side cavity region 2904, and a third low-K dielectric material 3106 is deposited to fill a third portion of drain side cavity region 2904. Here, the first, second, and third low-K dielectric materials may each have a different dielectric constant (K) value. Any suitable number of dielectric materials with differing low-K dielectric constant (K) values may be used to fill drain side cavity region 2904.

Figure 32:
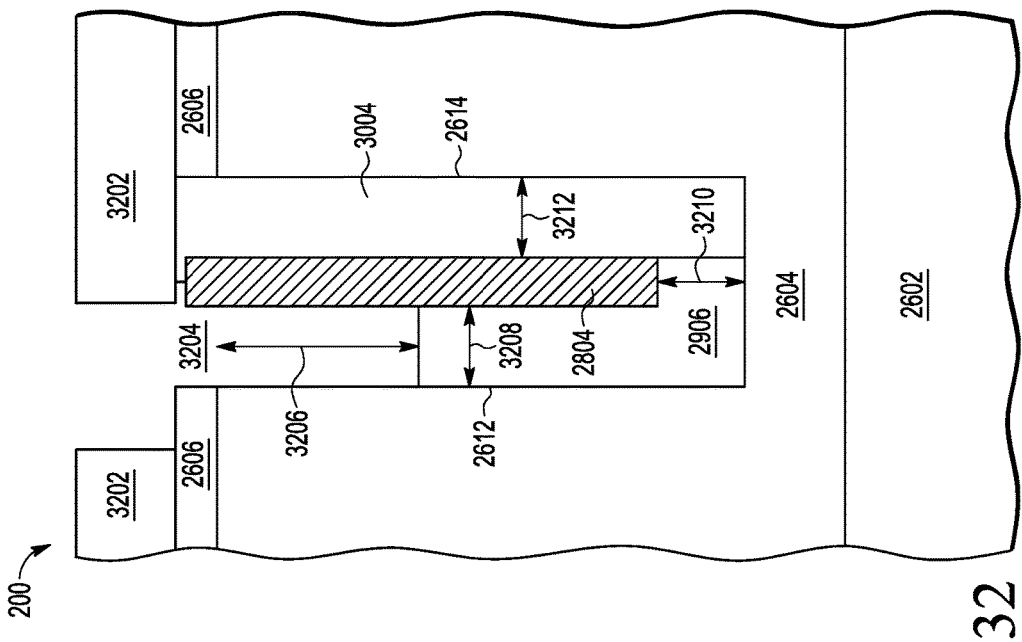

FIG. 32 illustrates in a simplified cross-sectional view, exemplary semi-vertical FET 200 at a subsequent stage of manufacture in accordance with an embodiment of the present invention. In this embodiment, FIG. 32 depicts a stage of manufacture subsequent to FIG. 30. At this stage of manufacture, a photoresist material 3202 is deposited and patterned. A portion of dielectric region 2906 is subsequently etched to a depth 3206 forming a gate cavity region 3204. The dielectric region 2906 may be etched by way of wet or dry etch processes or combinations thereof to form gate cavity 3204. In this embodiment, the depth 3206 dimension corresponds approximately to a transistor gate length of the semi-vertical FET 200.

Source side dielectric region 2906 includes source side dielectric thickness 3208 and bottom side dielectric thickness 3210, and drain side dielectric region 3004 includes drain side dielectric thickness 3212. In this embodiment, thicknesses 3208, 3210, and 3212 may each have substantially a same thickness value in a range of 0.2-0.4 microns for a given semi-vertical FET 100 voltage specification, for example. In some embodiment, thickness values for thicknesses 3208-3212 may differ from one another. Other embodiments may include other thickness values for thicknesses 3208-3212 based on semi-vertical FET 100 voltage specifications.

Figure 33:
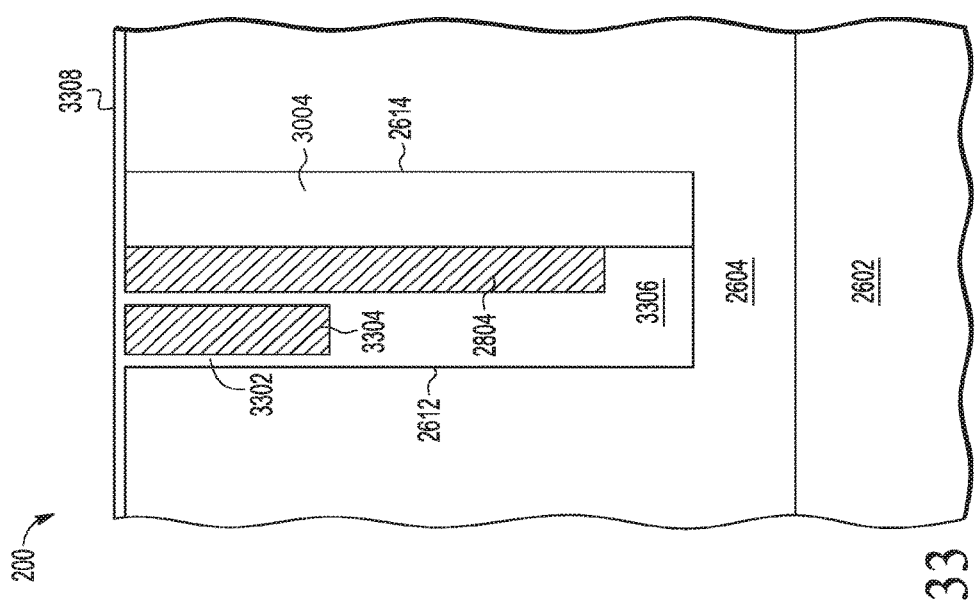

FIG. 33 illustrates in a simplified cross-sectional view, exemplary semi-vertical FET 200 at a subsequent stage of manufacture in accordance with an embodiment of the present invention. After forming gate cavity region 3204 (FIG. 32), a gate electrode 3304 is formed. At this stage of manufacture, patterned photoresist material 3202 (FIG. 32) is removed. A gate dielectric region 3302 is formed on the sidewall 2612 and other surfaces of gate cavity region 3204. For example, gate dielectric region 3302 may be formed by growing an oxide material to a predetermined thickness. After forming gate dielectric region 3302, a conductive material (e.g. polysilicon) is deposited such that a remaining portion of the gate cavity region 3204 is substantially filled to form gate electrode 3304. Gate electrode 3304 is formed such that it is separated from the sidewall 2612 by gate dielectric region 3302. After deposition of the conductive material to form gate electrode 3304, a top surface 3308 is planarized removing hard mask 2606. An oxide layer is grown to seal exposed portions of the gate electrode 3304 and vertical field plate 2804.

Figure 34:
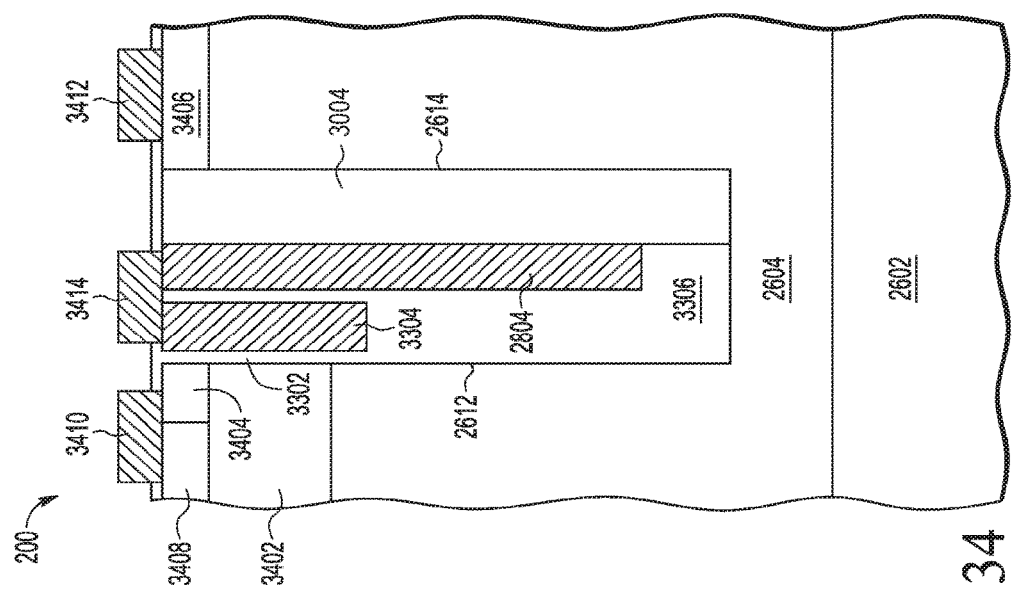

FIG. 34 illustrates in a simplified cross-sectional view, exemplary semi-vertical FET 200 at a subsequent stage of manufacture in accordance with an embodiment of the present invention. At this stage of manufacture, semi-vertical FET 200 includes body region 3402, source and drain regions 3404 and 3406, body tie region 3408, and contacts 3410-3414.

Body region 3402 is formed as a P-type well dopant implanted region in substrate 2616 (FIG. 26) having at least a portion of the implanted region adjacent to sidewall 2612. The body region 3402 may be characterized as a P− (minus) body region. After body region 3402 is formed, N-type dopants are implanted to form source and drain regions 3404 and 3406 respectively. Source and drain regions 3404 and 3406 may be characterized as N+ (plus) source/drain regions. Source region 3404 is formed having at least a portion of the source implanted region adjacent to sidewall 3612 and drain region 3406 is formed having at least a portion of the drain implanted region adjacent to sidewall 2614. P-type dopant is implanted to form body tie region 3408 which allows electrical connectivity with body region 3402. Body tie region 3408 may be characterized as a P+ (plus) body tie region. At least a portion of body tie region 3408 abuts a portion of source region 3404.

At top surface 3308, dielectric region 3306 is patterned and etched to expose portions of gate electrode 3304 and vertical field plate 2804, source and drain regions 3404 and 3406, and body tie region 3408. After the dielectric region 3306 is patterned and etched, contacts 3410-3414 are formed allowing electrical connectivity to the gate electrode 3304, vertical field plate 2804, source and drain regions 3404 and 3406, and body tie region 3408. Contacts may be formed from any suitable conductive material such as copper, gold, silver, aluminum, nickel, tungsten, and alloys thereof, for example. In this embodiment, contact 3414 is shared allowing electrical connectivity with both gate electrode 3304 and vertical field plate 2804. In some embodiments, a first contact may be formed to contact gate electrode 3304 and a second contact may be formed to contact vertical field plate 2804 where the first and second contacts are separate from each other. In this arrangement, vertical field plate 2804 may be connected to a receive a voltage signal different from a voltage signal provided at gate electrode 3304, for example (see FIG. 46).

Figures 35, 36:
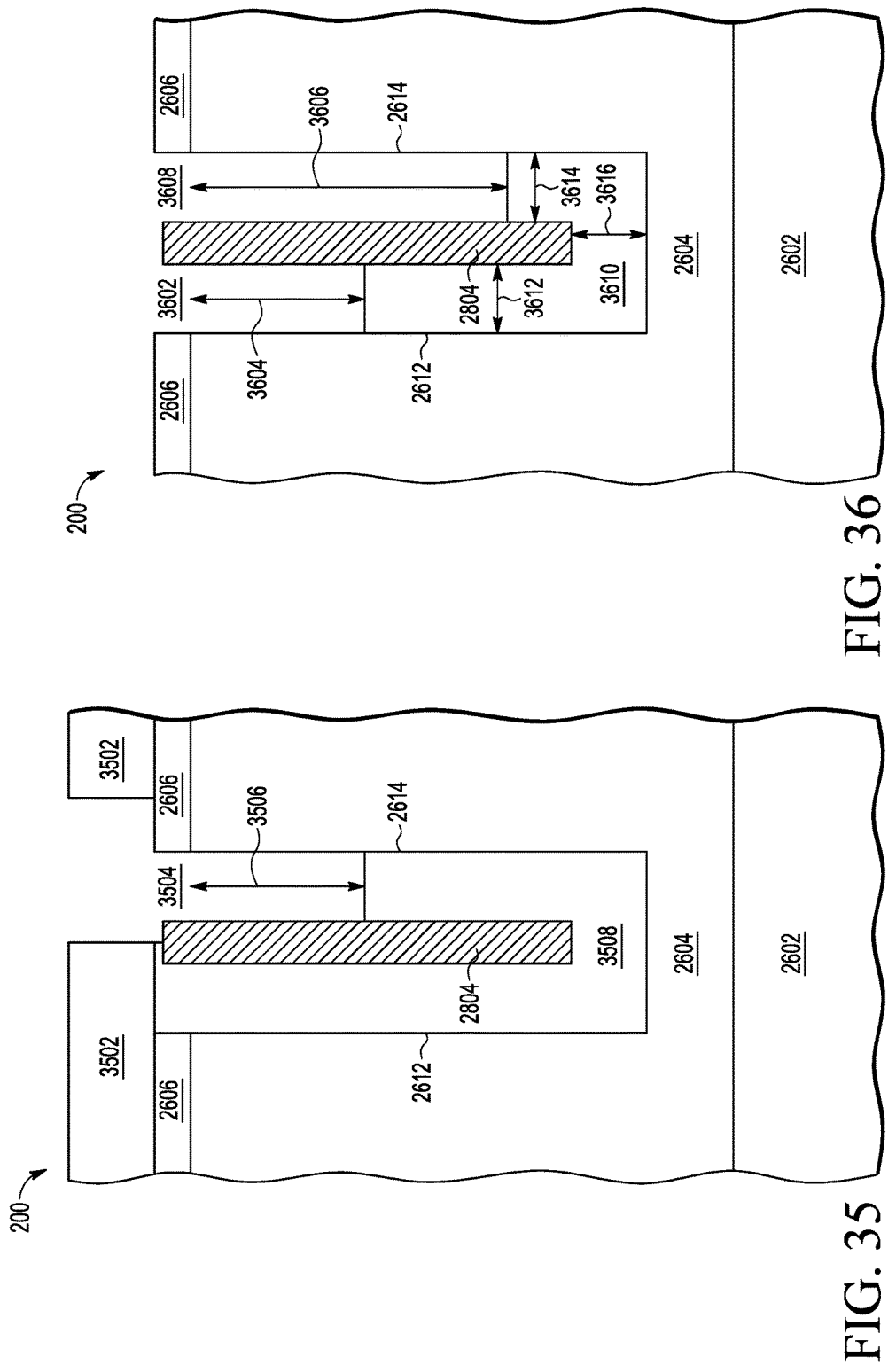
FIG. 35 through FIG. 41 illustrate, in simplified cross-sectional view, stages of manufacture of exemplary FET formed in accordance with another embodiment of the present invention.

FIG. 35 through FIG. 41 illustrate, in simplified cross-sectional views, various stages of manufacture of an exemplary semi-vertical field effect transistor (FET) 200 formed in accordance with another embodiment of the present invention. In this embodiment, stages of manufacture of an exemplary semi-vertical field effect transistor (FET) 200 depicted in FIG. 26 through FIG. 28 remain the same. For example, FIG. 35 depicts a stage of manufacture subsequent to FIG. 28 in another embodiment.

FIG. 35 illustrates in a simplified cross-sectional view, exemplary semi-vertical FET 200 at a subsequent stage of manufacture in accordance with an embodiment of the present invention. After planar top surface 2802 is formed and vertical field plate 2804 is enclosed by dielectric region 2806 (FIG. 28), dielectric region 2806 is etched to form drain side cavity region 3504. At this stage, a photoresist material 3502 is deposited and patterned. A drain side portion of dielectric region 2806 (FIG. 28) between vertical field plate 2804 and sidewall 2614 is subsequently etched to a first predetermined depth 3506 forming drain side cavity region 3504 and remaining dielectric region 3508. The drain side portion of dielectric region 2806 may be etched by way of wet or dry etch processes or combinations thereof to form drain side field plate cavity 3504.

FIG. 36 illustrates in a simplified cross-sectional view, exemplary semi-vertical FET 200 at a subsequent stage of manufacture in accordance with an embodiment of the present invention. After forming drain side cavity region 3504 at first predetermined depth 3506 (FIG. 35), a source side cavity region 3602 and drain side cavity region 3608 are formed. At this stage of manufacture, patterned photoresist material 3502 is removed and remaining dielectric region 3508 (FIG. 35) is blanket etched to a second predetermined depth 3604. In this embodiment, the depth 3604 dimension corresponds approximately to a transistor gate length of the semi-vertical FET 200. Because remaining dielectric region 3508 is blanket etched, source side cavity region 3602 and drain side cavity region 3608 are formed concurrently. For example, source side cavity region is formed at a depth 3604 and drain side cavity region is formed at a depth 3606, where depth 3606 equals the sum of depth 3506 (FIG. 35) and depth 3604. The dielectric region 3508 may be etched by way of a blanket wet or dry etch processes or combinations thereof to form cavity regions 3602 and 3608. After blanket etch forms cavity regions 3602 and 3608, dielectric region 3610 remains.

In some embodiments, it may be desirable to concurrently form cavity regions 3602 and 3608 to a common depth by omitting the stage of manufacture depicted in FIG. 35. Source side cavity region 3602 and drain side cavity region 3608 may be formed to have substantially symmetric cavity region depths. For example, it may be desirable to form source side cavity region 3602 at depth 3604 and drain side cavity region at a depth similar to depth 3604.

Dielectric region 3610 includes source side dielectric thickness 3612, bottom side dielectric thickness 3616, and drain side dielectric thickness 3614. In this embodiment, thicknesses 3612, 3614, and 3616 may each have substantially a same thickness value in a range of 0.2-0.4 microns for a given semi-vertical FET 100 voltage specification, for example. In some embodiment, thickness values for thicknesses 3612-3616 may differ from one another. Other embodiments may include other thickness values for thicknesses 3612-3616 based on semi-vertical FET 100 voltage specifications.

Figure 37:
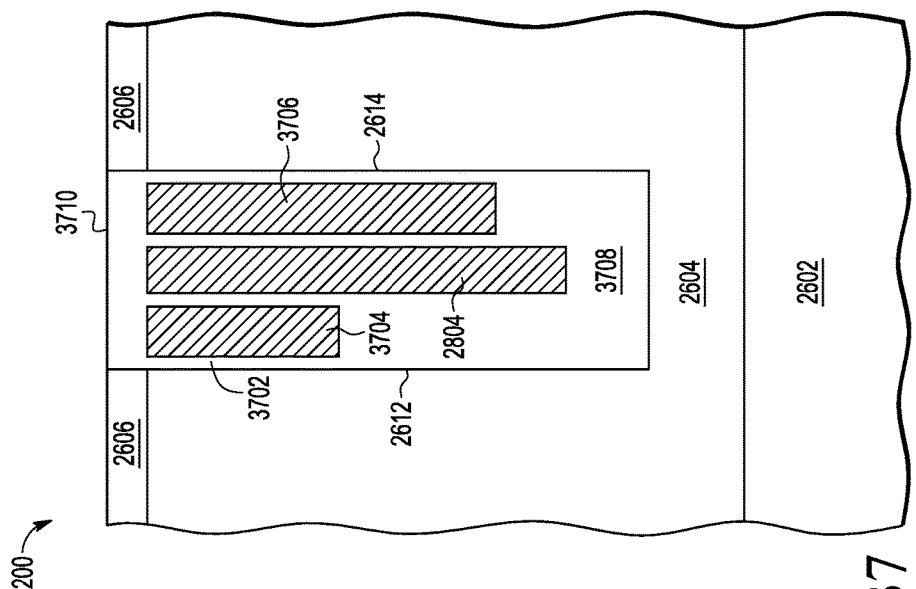

FIG. 37 illustrates in a simplified cross-sectional view, exemplary semi-vertical FET 200 at a subsequent stage of manufacture in accordance with an embodiment of the present invention. After forming cavity regions 3602 and 3608 (FIG. 36), a gate electrode 3704 is formed. At this stage of manufacture, a gate dielectric region 3702 is formed on exposed portions of sidewalls 2612 and 2614 and on other exposed surfaces of cavity regions 3602 and 3608. For example, gate dielectric region 3702 may be formed by growing an oxide material to a predetermined thickness. After forming gate dielectric region 3702 on exposed portions of sidewalls 2612 and 2614 and on other exposed surfaces of cavity regions 3602 and 3608, a conductive material (e.g. polysilicon) is deposited such that remaining cavity portions of cavity regions 3602 and 3608 are substantially filled to form gate electrode 3704 and drain side conductive region 3706. Gate electrode 3704 is formed such that it is separated from the sidewall 2612 by gate dielectric region 3702. After deposition of the conductive material to form gate electrode 3704 and conductive region 3706, a top surface 3710 is planarized. An oxide layer is grown to seal exposed portions of the gate electrode 3704 and regions 2804 and 3706. Dielectric region 3708 surrounds gate electrode 3704, and conductive regions 2804 and 3706.

Figure 38:
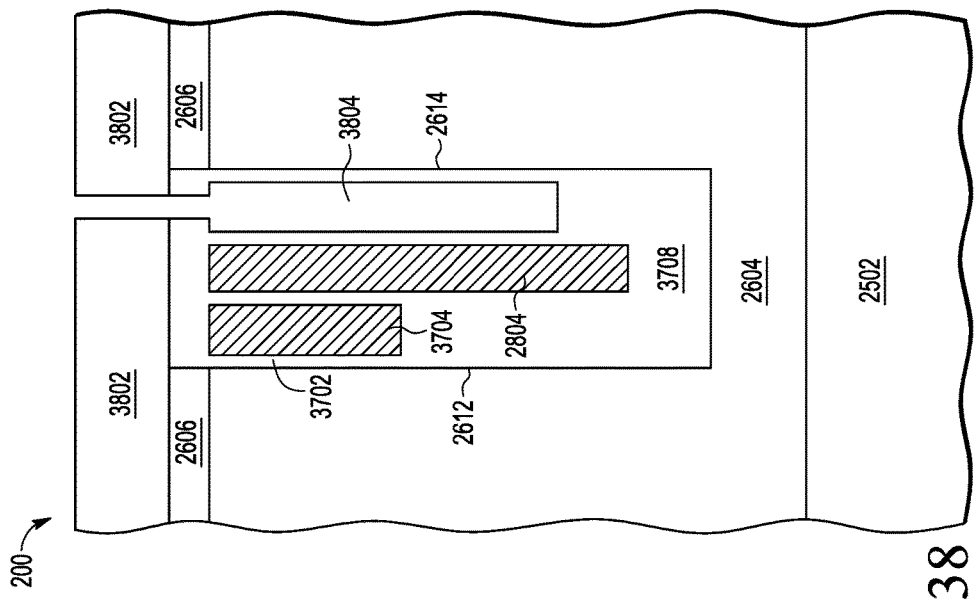

FIG. 38 illustrates in a simplified cross-sectional view, exemplary semi-vertical FET 200 at a subsequent stage of manufacture in accordance with an embodiment of the present invention. After forming gate electrode 3704 and drain side conductive region 3706, drain side conductive region 3706 is removed forming drain side cavity 3804. At this stage, a hard mask layer 3802 (e.g., nitride material) is deposited and patterned such that a narrow opening is located over the top of the drain side conductive region 3706. Drain side conductive region 3706 is subsequently etched to substantially remove drain side conductive region 3706, thus forming drain side cavity region 3804. Dielectric region 3708 is anisotropically etched to form a narrow opening and expose a top portion of drain side conductive region 3706. The (polysilicon) drain side conductive region 3706 is subsequently etched isotropically with a high selectivity etchant (e.g., SF6 plasma).

Figure 39:
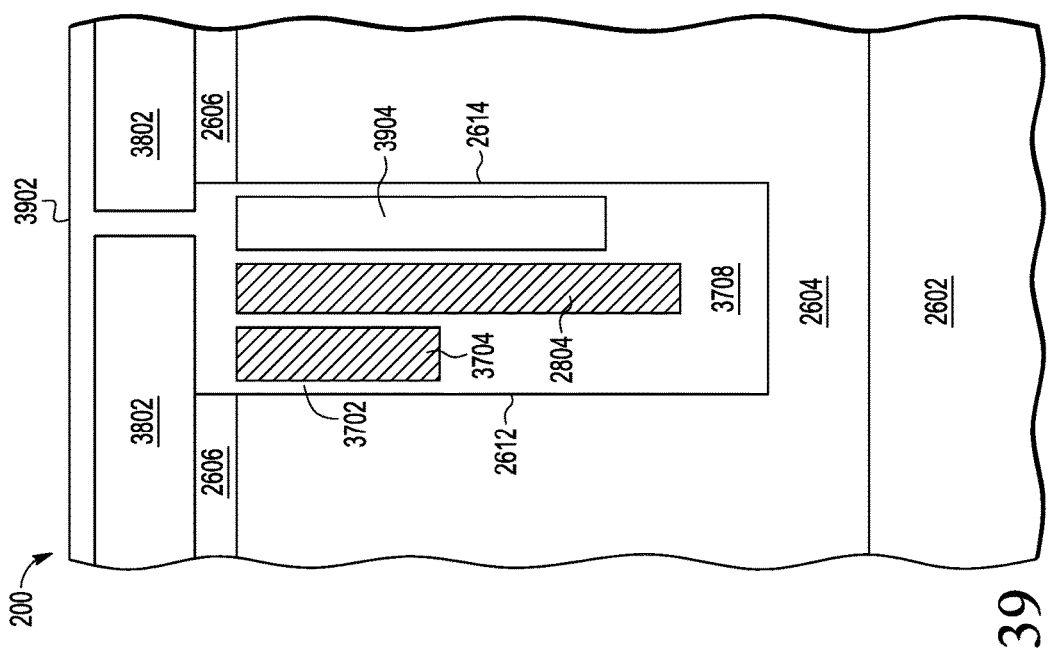

FIG. 39 illustrates in a simplified cross-sectional view, exemplary semi-vertical FET 200 at a subsequent stage of manufacture in accordance with an embodiment of the present invention. After forming drain side cavity 3804, a sealed drain side cavity region 3904 is formed. At this stage of manufacture, a dielectric material 3902 is (e.g., oxide) is grown or deposited to close or bridge the narrow opening at top portion of drain side cavity region 3804. In this embodiment, the opening at top portion of drain side cavity region 3804 may be closed or bridged by a deposition process such as low pressure chemical vapor deposition (LPCVD) to enclose drain side cavity region 3904 at near vacuum pressure. A grown oxide may follow the LPCVD process to further fill opening between nitride layer 3802 portions. Dielectric region 3708 substantially encloses gate electrode 3704, conductive region 2804, and sealed drain side cavity region 3904.

Figure 40:
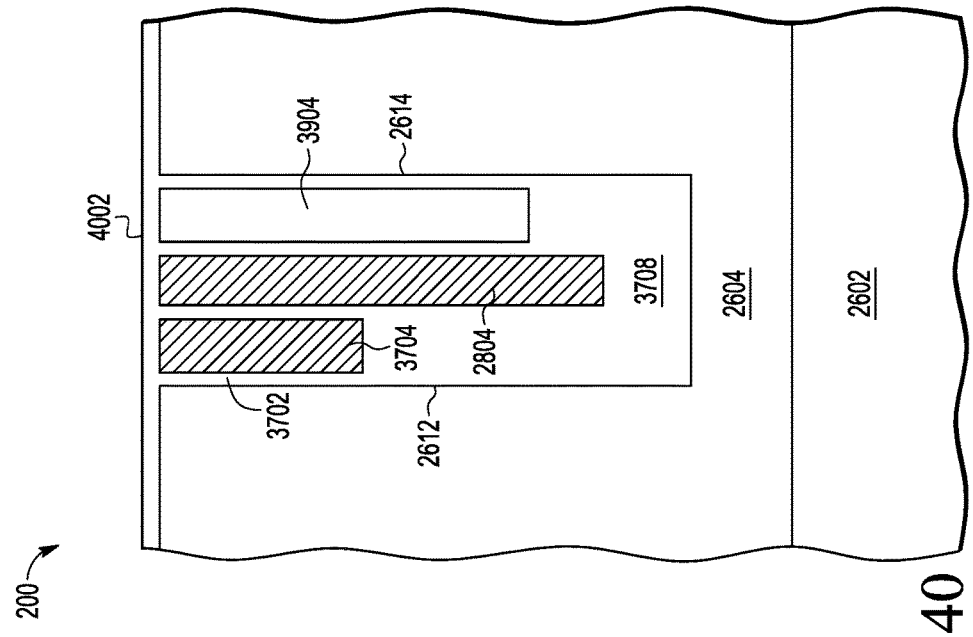

FIG. 40 illustrates in a simplified cross-sectional view, exemplary semi-vertical FET 200 at a subsequent stage of manufacture in accordance with an embodiment of the present invention. After forming sealed drain side cavity region 3904 (FIG. 39), a top surface of semi-vertical FET 200 is planarized. At this stage of manufacture, patterned hard materials 3802 and 2606 (FIG. 39) are removed by way of a planarization process (e.g. by way of CMP process) and nitride strip etch. After planarization and strip etch, a dielectric layer is formed at top surface 4002 over portions of gate electrode 3704, vertical field plate 2804, and sealed drain side cavity region 3904.

Figure 41:
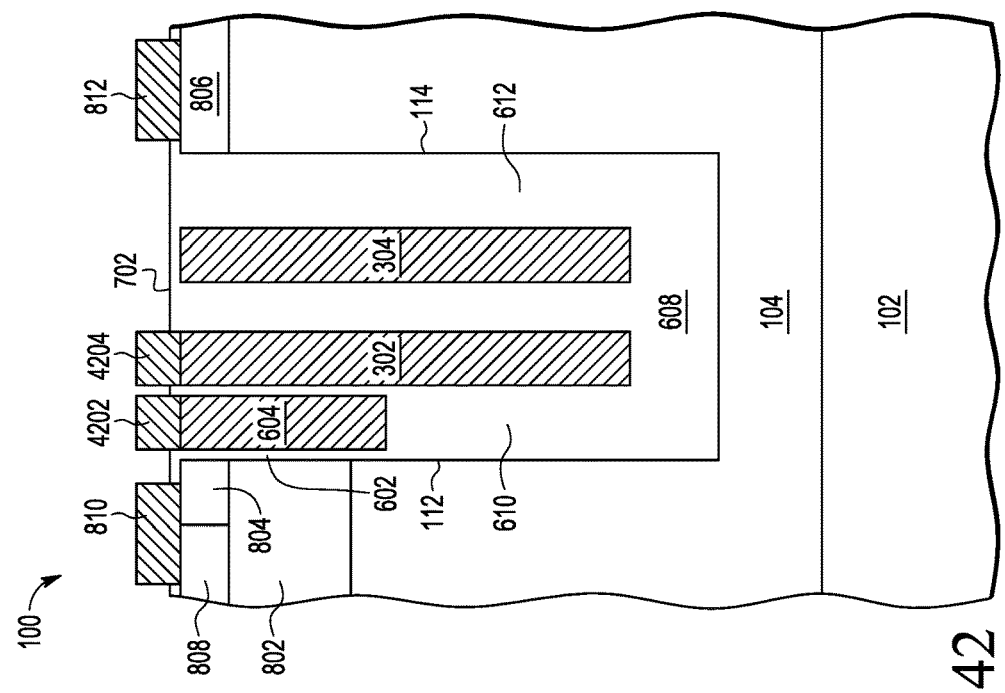

FIG. 41 illustrates in a simplified cross-sectional view, exemplary semi-vertical FET 200 at a subsequent stage of manufacture in accordance with an embodiment of the present invention. At this stage of manufacture, semi-vertical FET 200 includes body region 4102, source and drain regions 4104 and 4106, body tie region 4108, and contacts 4110-4114.

Body region 4102 is formed as a P-type well dopant implanted region in substrate 2616 (FIG. 26) having at least a portion of the implanted region adjacent to sidewall 2612. The body region 4102 may be characterized as a P− (minus) body region. After body region 4102 is formed, N-type dopants are implanted to form source and drain regions 4104 and 4106 respectively. Source and drain regions 4104 and 4106 may be characterized as N+(plus) source/drain regions. Source region 4104 is formed having at least a portion of the source implanted region adjacent to sidewall 2612 and drain region 4106 is formed having at least a portion of the drain implanted region adjacent to sidewall 2614. P-type dopant is implanted to form body tie region 4108 which allows electrical connectivity with body region 4102. Body tie region 4108 may be characterized as a P+ (plus) body tie region. At least a portion of body tie region 4108 abuts a portion of source region 4104.

At top surface 4002, dielectric region 3708 is patterned and etched to expose portions of gate electrode 3704 and vertical field plate 2804, source and drain regions 4104 and 4106, and body tie region 4108. After the dielectric region 3708 is patterned and etched, contacts 4110-4114 are formed allowing electrical connectivity to the gate electrode 3704, vertical field plate 2804, source and drain regions 4104 and 4106, and body tie region 4108. Contacts may be formed from any suitable conductive material such as copper, gold, silver, aluminum, nickel, tungsten, and alloys thereof, for example. In this embodiment, contact 4114 is shared allowing electrical connectivity with both gate electrode 3704 and vertical field plate 2804. In some embodiments, a first contact may be formed to contact gate electrode 3704 and a second contact may be formed to contact vertical field plate 2804 where the first and second contacts are separate from each other. In this arrangement, vertical field plate 2804 may be connected to a receive a voltage signal different from a voltage signal provided at gate electrode 3704, for example (see FIG. 47).

FIG. 42 through FIG. 47 illustrate, in simplified cross-sectional views, exemplary semi-vertical field effect transistors (FET) 100 and 200 formed in accordance with another embodiment of the present invention.

Figure 42:
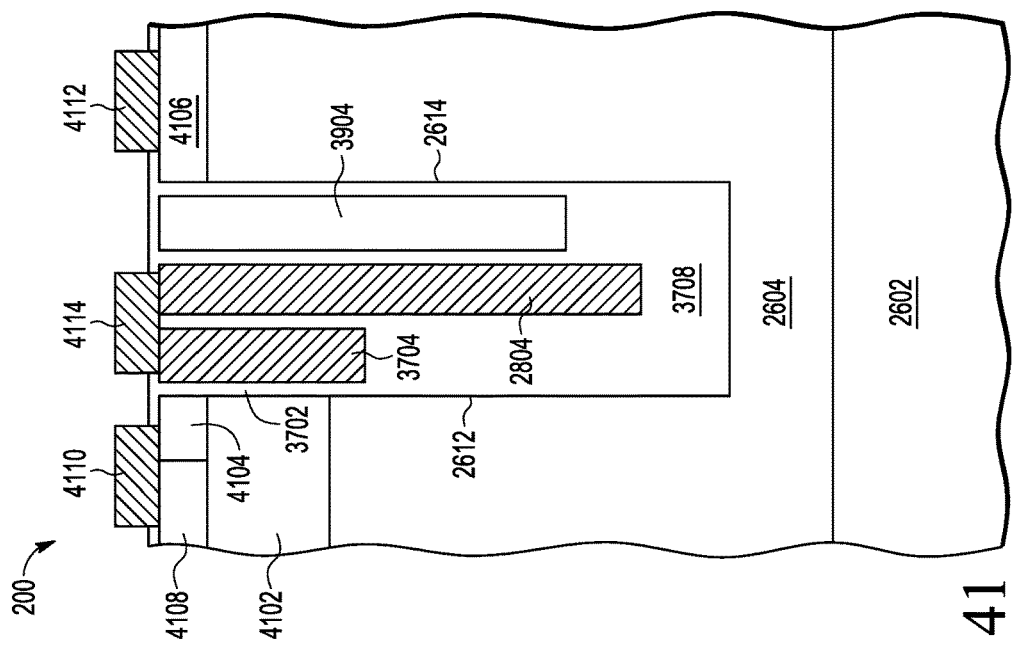

FIG. 42 illustrates in a simplified cross-sectional view, exemplary semi-vertical FET 100 at a stage of manufacture in accordance with another embodiment of the present invention. FIG. 42 depicts another embodiment for the stage of manufacture depicted in FIG. 8. In the embodiment of FIG. 8, contact 814 is shared forming an electrical connection with both gate electrode 604 and source side field plate 302. In the embodiment depicted in FIG. 42, a first contact 4202 is formed to electrically connect gate electrode 604 and a second contact 4204 is formed to electrically connect source field plate 302. First and second contacts 4202 and 4204 are separate from each other. In this arrangement, source field plate 302 may be connected by way of contact 4204 to receive a voltage signal different from a voltage signal received at gate electrode 604 by way of contact 4202, for example.

Figures 43, 44:
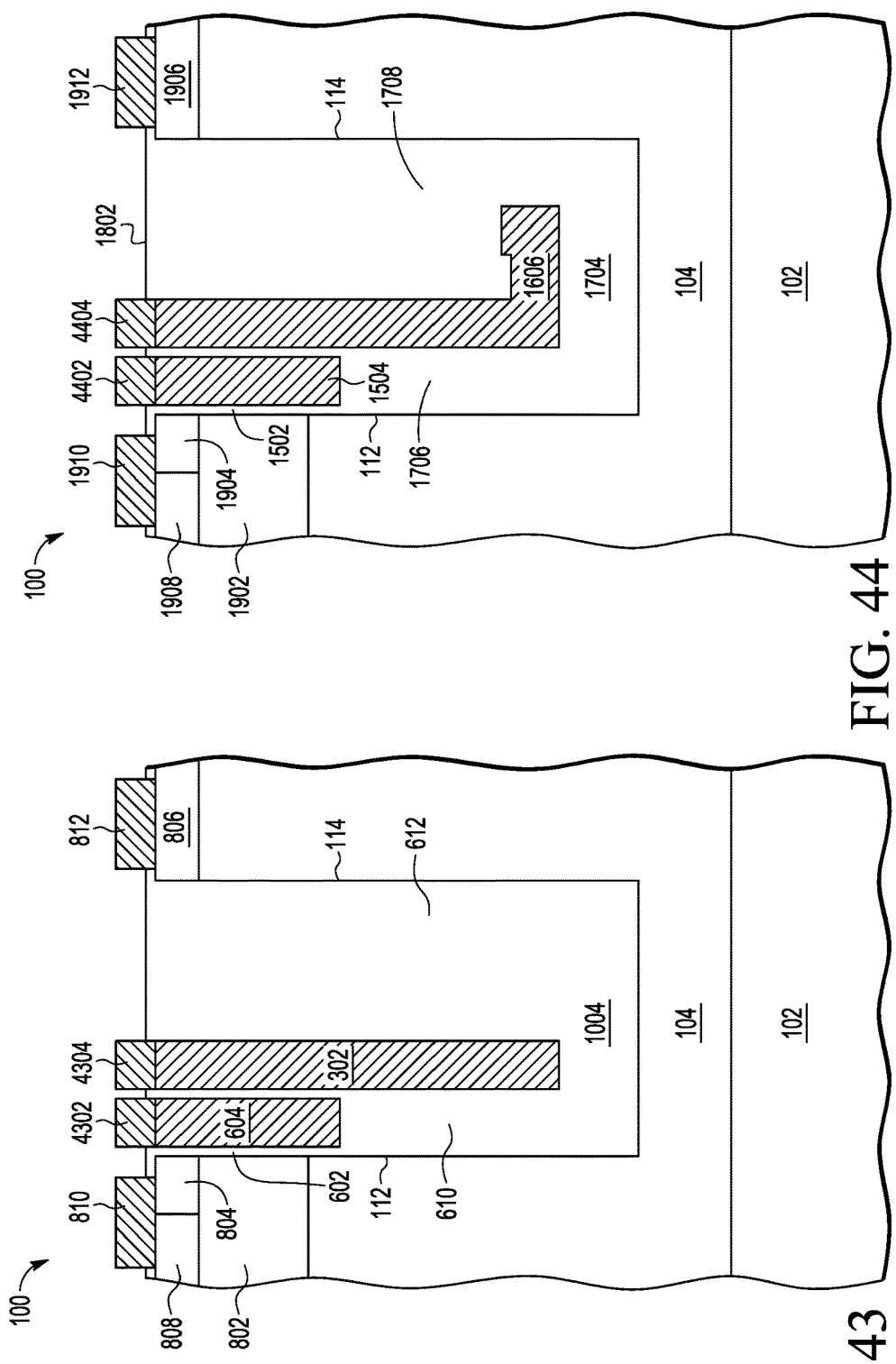

FIG. 43 illustrates in a simplified cross-sectional view, exemplary semi-vertical FET 100 at a stage of manufacture in accordance with another embodiment of the present invention. FIG. 43 depicts another embodiment for the stage of manufacture depicted in FIG. 12. In the embodiment of FIG. 12, contact 814 is shared forming an electrical connection with both gate electrode 604 and source side field plate 302. In the embodiment depicted in FIG. 43, a first contact 4302 is formed to electrically connect gate electrode 604 and a second contact 4304 is formed to electrically connect source field plate 302. First and second contacts 4302 and 4304 are separate from each other. In this arrangement, source field plate 302 may be connected by way of contact 4304 to receive a voltage signal different from a voltage signal received at gate electrode 604 by way of contact 4302, for example.

FIG. 44 illustrates in a simplified cross-sectional view, exemplary semi-vertical FET 100 at a stage of manufacture in accordance with another embodiment of the present invention. FIG. 44 depicts another embodiment for the stage of manufacture depicted in FIG. 19. In the embodiment of FIG. 19, contact 1914 is shared forming an electrical connection with both gate electrode 1504 and J-shaped field plate 1606. In the embodiment depicted in FIG. 44, a first contact 4402 is formed to electrically connect gate electrode 1504 and a second contact 4404 is formed to electrically connect J-shaped field plate 1606. First and second contacts 4402 and 4404 are separate from each other. In this arrangement, J-shaped field plate 1606 may be connected by way of contact 4404 to receive a voltage signal different from a voltage signal received at gate electrode 1504 by way of contact 4402, for example.

FIG. 45 illustrates in a simplified cross-sectional view, exemplary semi-vertical FET 100 at a stage of manufacture in accordance with another embodiment of the present invention. FIG. 45 depicts another embodiment for the stage of manufacture depicted in FIG. 25. In the embodiment of FIG. 25, contact 2514 is shared forming an electrical connection with both gate electrode 2104 and vertical field plate 302. In the embodiment depicted in FIG. 45, a first contact 4502 is formed to electrically connect gate electrode 2104 and a second contact 4504 is formed to electrically connect vertical field plate 302. First and second contacts 4502 and 4504 are separate from each other. In this arrangement, vertical field plate 302 may be connected by way of contact 4504 to receive a voltage signal different from a voltage signal received at gate electrode 2104 by way of contact 4502, for example.

FIG. 46 illustrates in a simplified cross-sectional view, exemplary semi-vertical FET 200 at a stage of manufacture in accordance with another embodiment of the present invention. FIG. 46 depicts another embodiment for the stage of manufacture depicted in FIG. 34. In the embodiment of FIG. 34, contact 3414 is shared forming an electrical connection with both gate electrode 3304 and vertical field plate 2804. In the embodiment depicted in FIG. 46, a first contact 4602 is formed to electrically connect gate electrode 3304 and a second contact 4604 is formed to electrically connect vertical field plate 2804. First and second contacts 4602 and 4604 are separate from each other. In this arrangement, vertical field plate 2804 may be connected by way of contact 4604 to receive a voltage signal different from a voltage signal received at gate electrode 3304 by way of contact 4602, for example.

Figure 47:
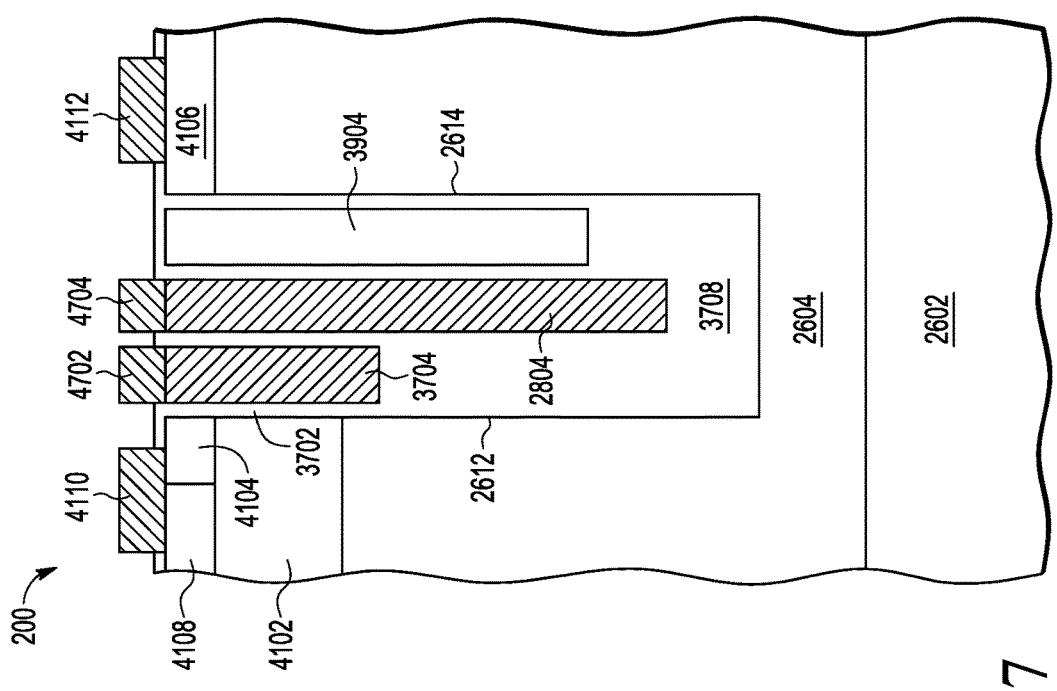

FIG. 47 illustrates in a simplified cross-sectional view, exemplary semi-vertical FET 200 at a stage of manufacture in accordance with another embodiment of the present invention. FIG. 47 depicts another embodiment for the stage of manufacture depicted in FIG. 41. In the embodiment of FIG. 41, contact 4114 is shared forming an electrical connection with both gate electrode 3704 and vertical field plate 2804. In the embodiment depicted in FIG. 47, a first contact 4702 is formed to electrically connect gate electrode 3704 and a second contact 4704 is formed to electrically connect vertical field plate 2804. First and second contacts 4702 and 4704 are separate from each other. In this arrangement, vertical field plate 2804 may be connected by way of contact 4704 to receive a voltage signal different from a voltage signal received at gate electrode 3704 by way of contact 4702, for example.

Generally, there is provided, a transistor including a trench formed in a semiconductor substrate, the trench having a first sidewall and a second sidewall; a vertical field plate formed in the trench, the vertical field plate located between the first sidewall and the second sidewall; a gate electrode formed in the trench, a first edge of the gate electrode proximate to the first sidewall and a second edge of the gate electrode proximate to the vertical field plate; a dielectric material formed in the trench between the first sidewall and the vertical field plate; and an air cavity formed in the trench between the vertical field plate and the second sidewall, the air cavity having a dielectric constant lower than that of the dielectric material. The air cavity formed in the trench may include a low pressure or vacuum. The air cavity may extend into the trench a depth equal to or greater than a depth of the gate electrode. The transistor may further include a source region formed in the semiconductor substrate having at least a portion of the source region adjacent to the first sidewall, and a drain region formed in the semiconductor substrate having at least a portion of the drain region adjacent to the second sidewall. The transistor may further include a body region formed in the semiconductor substrate having at least a portion of the body region adjacent to the first sidewall, the source region formed in the body region. A portion of the dielectric material may extend between a bottom edge of the vertical field plate and a bottom surface of the trench, and between a bottom edge of the air cavity and the bottom surface of the trench. The transistor may further include a first contact region connected to the gate electrode, the first contact region configured to receive a first voltage signal. The first contact region may be connected to the vertical field plate and to the gate electrode. The transistor may further include a second contact region connected to the vertical field plate, the second contact region configured to receive a second voltage signal, the second voltage signal different from the first voltage signal.

In another embodiment, there is provided, a method including etching a trench in a semiconductor substrate, the trench having a first sidewall and a second sidewall; depositing a first conductive material to form a vertical field plate in the trench; depositing a second conductive material to form a control gate in the in the trench, the control gate disposed between the first sidewall and the vertical field plate; forming a dielectric region in the trench between the first sidewall and a first edge of the vertical field plate, the dielectric region having a first dielectric constant; and forming air cavity region in the trench between the second sidewall and a second edge of the vertical field plate, the air cavity region having a second dielectric constant lower than the first dielectric constant. The method may further include forming a gate dielectric on at least a portion of the first sidewall in the trench, the gate dielectric formed before depositing the second conductive material. The method may further include forming a source region in the semiconductor substrate having at least a portion of the source region adjacent to the first sidewall, and forming a drain region in the semiconductor substrate having at least a portion of the drain region adjacent to the second sidewall. The method may further include forming a body region in the semiconductor substrate having at least a portion of the body region adjacent to the first sidewall, the source region formed in the body region. The method may further include forming a first contact connected to the gate electrode, the first contact configured to receive a first voltage signal. The first contact may be connected to the vertical field plate and the gate electrode. The method may further include forming a second contact connected to the vertical field plate, the second contact configured to receive a second voltage signal, the second voltage signal different from the first voltage signal.

In yet another embodiment, there is provided, a transistor including a trench formed in a semiconductor substrate, the trench having a first sidewall and a second sidewall; a vertical field plate formed in the trench, the vertical field plate located between the first sidewall and the second sidewall; a gate dielectric formed on at least a portion of the first sidewall in the trench; a gate electrode formed in the trench, a first edge of the gate electrode adjacent to the gate dielectric and a second edge of the gate electrode proximate to the vertical field plate; a dielectric material formed in the trench between the first sidewall and the vertical field plate; and an air cavity formed in the trench between the vertical field plate and the second sidewall, the air cavity having a dielectric constant lower than that of the dielectric material. The trench may be formed in an epitaxial layer of the semiconductor substrate. The transistor may further include a source region formed in the semiconductor substrate having at least a portion of the source region adjacent to the first sidewall, and a drain region formed in the semiconductor substrate having at least a portion of the drain region adjacent to the second sidewall. The transistor may further include a contact region connected to the gate electrode and vertical field plate, the contact region configured to receive a voltage signal.

By now it should be appreciated that there has been provided, a semi-vertical power field effect transistor (FET) and method of forming the same. A trench formed in a semiconductor substrate includes a gate electrode and field plate which provides a compact footprint for the power FET. Source and drain regions are formed at the surface of the semiconductor substrate adjacent to the trench. By forming a drain side dielectric region in the trench to be substantially thicker than a source side dielectric region, higher breakdown voltages and improved on-resistance*area (RonA) can be realized. A second field plate formed in the drain side dielectric region can facilitate higher breakdown voltages as well. Another compact footprint of the power FET includes symmetrical source and drain side dielectric regions which employ a low-K region on the drain side to support high voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A transistor comprising:
   a trench formed in a semiconductor substrate, the trench having a first sidewall and a second sidewall;
   a vertical field plate formed in the trench, the vertical field plate located between the first sidewall and the second sidewall;
   a gate electrode formed in the trench, a first edge of the gate electrode proximate to the first sidewall and a second edge of the gate electrode proximate to the vertical field plate;
   a dielectric material formed in the trench between the first sidewall and the vertical field plate; and
   an air cavity formed in the trench between the vertical field plate and the second sidewall, the air cavity having a dielectric constant lower than that of the dielectric material.

2. The transistor of claim 1, wherein the air cavity formed in the trench comprises a low pressure or vacuum.

3. The transistor of claim 1, wherein the air cavity extends into the trench a depth equal to or greater than a depth of the gate electrode.

4. The transistor of claim 1, further comprising a source region formed in the semiconductor substrate having at least a portion of the source region adjacent to the first sidewall, and a drain region formed in the semiconductor substrate having at least a portion of the drain region adjacent to the second sidewall.

5. The transistor of claim 4, further comprising a body region formed in the semiconductor substrate having at least a portion of the body region adjacent to the first sidewall, the source region formed in the body region.

6. The transistor of claim 1, wherein a portion of the dielectric material extends between a bottom edge of the vertical field plate and a bottom surface of the trench, and between a bottom edge of the air cavity and the bottom surface of the trench.

7. The transistor of claim 1, further comprising a first contact region connected to the gate electrode, the first contact region configured to receive a first voltage signal.

8. The transistor of claim 7, wherein the first contact region is connected to the vertical field plate and to the gate electrode.

9. The transistor of claim 7, further comprising a second contact region connected to the vertical field plate, the second contact region configured to receive a second voltage signal, the second voltage signal different from the first voltage signal.

10. A transistor comprising:
    a trench formed in a semiconductor substrate, the trench having a first sidewall and a second sidewall;
    a vertical field plate formed in the trench, the vertical field plate located between the first sidewall and the second sidewall;

a gate dielectric formed on at least a portion of the first sidewall in the trench;

a gate electrode formed in the trench, a first edge of the gate electrode adjacent to the gate dielectric and a second edge of the gate electrode proximate to the vertical field plate;

a dielectric material formed in the trench between the first sidewall and the vertical field plate; and an air cavity formed in the trench between the vertical field plate and the second sidewall, the air cavity having a dielectric constant lower than that of the dielectric material.

11. The transistor of claim 10, wherein the trench is formed in an epitaxial layer of the semiconductor substrate.

12. The transistor of claim 10, further comprising a source region formed in the semiconductor substrate having at least a portion of the source region adjacent to the first sidewall, and a drain region formed in the semiconductor substrate having at least a portion of the drain region adjacent to the second sidewall.

13. The transistor of claim 10, further comprising a contact region connected to the gate electrode and vertical field plate, the contact region configured to receive a voltage signal.

* * * * *